(12) United States Patent
Katayama

(10) Patent No.: US 8,937,329 B2
(45) Date of Patent: Jan. 20, 2015

(54) ENCAPSULATING SHEET, LIGHT EMITTING DIODE DEVICE, AND PRODUCING METHOD THEREOF

(71) Applicant: Nitto Denko Corporation, Ibaraki-shi, Osaka (JP)

(72) Inventor: Hiroyuki Katayama, Osaka (JP)

(73) Assignee: Nitto Denko Corporation, Osaka (JP)

( * ) Notice: Subject to any disclaimer, the term of this patent is extended or adjusted under 35 U.S.C. 154(b) by 0 days.

(21) Appl. No.: 13/784,013

(22) Filed: Mar. 4, 2013

(65) Prior Publication Data

US 2013/0234186 A1 Sep. 12, 2013

(30) Foreign Application Priority Data

Mar. 6, 2012 (JP) .................................. 2012-049032

(51) Int. Cl.
 *H01L 33/54* (2010.01)
 *H01L 33/50* (2010.01)
 *H01L 33/56* (2010.01)

(52) U.S. Cl.
 CPC .............. *H01L 33/54* (2013.01); *H01L 33/501* (2013.01); *H01L 33/56* (2013.01); *H01L 2933/005* (2013.01)
 USPC ............... 257/98; 428/161; 438/27; 362/308; 257/432; 257/433; 257/434; 257/666

(58) Field of Classification Search
 CPC ................. H01L 2924/00; H01L 2224/48247; H01L 2224/73265; H01L 2224/48091; H01L 2924/00014; G02F 1/133611; G02F 1/133603; G02F 2001/133614; F21Y 2101/02; G02B 19/0061; C09K 11/02; C09K 11/7774; C09K 11/06; C09K 11/0883

USPC ............................ 362/308; 257/432–433, 666
See application file for complete search history.

(56) References Cited

U.S. PATENT DOCUMENTS

| | | | |
|---|---|---|---|
| 2006/0175716 A1* | 8/2006 | Nakashima | 257/787 |
| 2007/0164308 A1* | 7/2007 | Yoshimura et al. | 257/103 |
| 2008/0218072 A1* | 9/2008 | Haruna et al. | 313/506 |
| 2009/0057699 A1 | 3/2009 | Basin et al. | |
| 2009/0061549 A1 | 3/2009 | Harada et al. | |
| 2009/0252932 A1* | 10/2009 | Kitano et al. | 428/195.1 |
| 2010/0181582 A1* | 7/2010 | Li et al. | 257/91 |

(Continued)

FOREIGN PATENT DOCUMENTS

| | | |
|---|---|---|
| EP | 2 031 666 A2 | 3/2009 |
| EP | 2 105 975 A1 | 9/2009 |
| JP | 2008-060166 | 3/2008 |

(Continued)

OTHER PUBLICATIONS

European Search Report issued in corresponding EP Application No. 13157796.7, dated Jul. 4, 2013.

*Primary Examiner* — David Vu
*Assistant Examiner* — Jonathan Han
(74) *Attorney, Agent, or Firm* — Sughrue Mion, PLLC

(57) ABSTRACT

An encapsulating sheet includes a transparent layer in which a concave portion that is dented from the surface inwardly is formed and a phosphor encapsulating layer which fills the concave portion. The transparent layer is formed from a transparent composition containing a first silicone resin composition and the phosphor encapsulating layer is formed from a phosphor encapsulating composition containing a phosphor and a second silicone resin composition.

5 Claims, 7 Drawing Sheets

(56) References Cited

U.S. PATENT DOCUMENTS

2010/0276712 A1* 11/2010 Shaikevitch et al. .......... 257/98
2011/0309384 A1 12/2011 Ito et al.

FOREIGN PATENT DOCUMENTS

| JP | 2009-60031 A | 3/2009 |
| JP | 2010-123802 A | 6/2010 |

* cited by examiner (a)

(b)

(a)

(b)

(c)

(a)

(b)

10

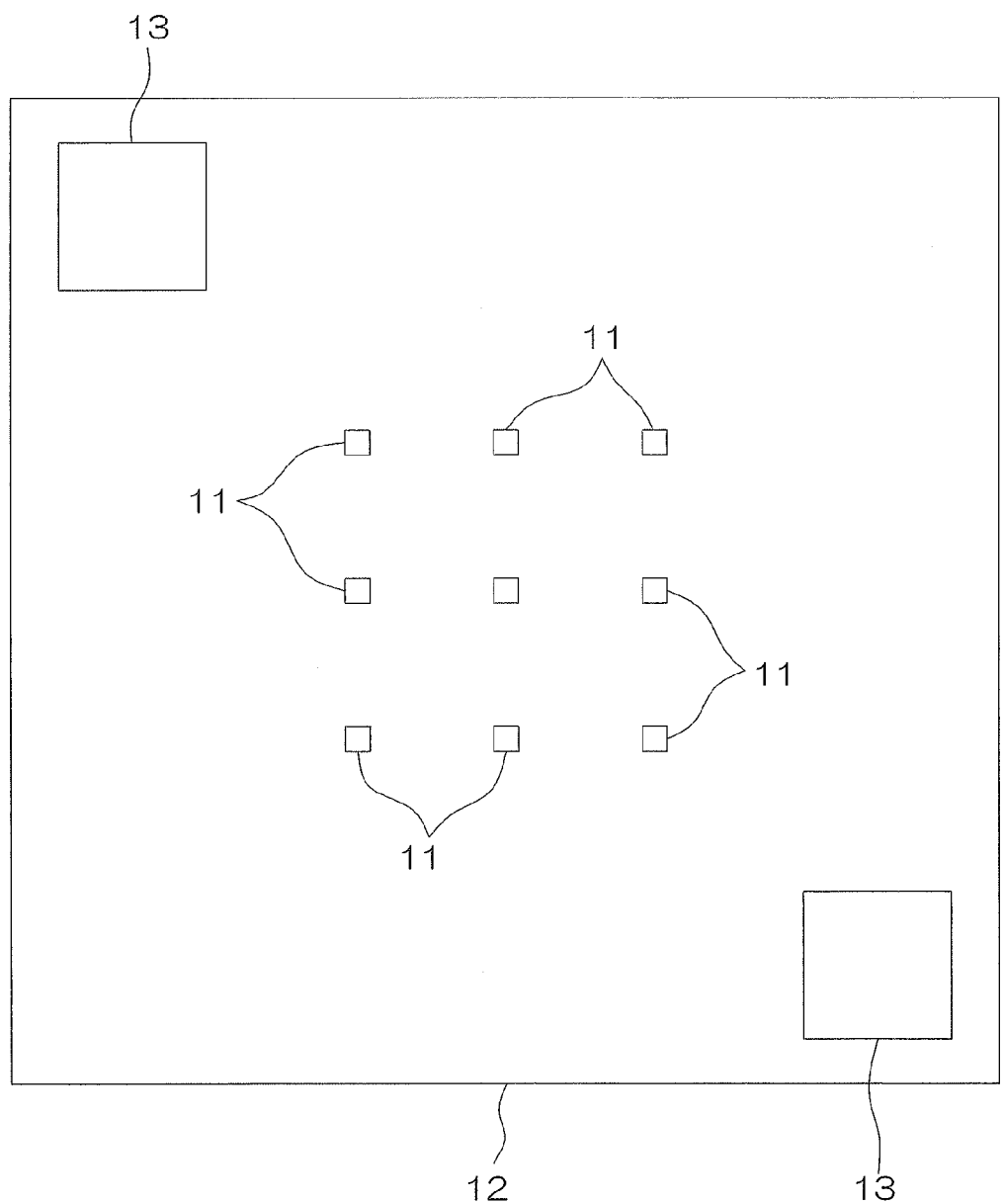

ENCAPSULATING SHEET, LIGHT EMITTING DIODE DEVICE, AND PRODUCING METHOD THEREOF

CROSS-REFERENCE TO RELATED APPLICATION

The present application claims priority from Japanese Patent Application No. 2012-049032 filed on Mar. 6, 2012, the contents of which are hereby incorporated by reference into this application.

BACKGROUND OF THE INVENTION

1. Field of the Invention

The present invention relates to an encapsulating sheet, a light emitting diode device, and a producing method thereof, to be specific, to an encapsulating sheet, a method for producing a light emitting diode device using the encapsulating sheet, and a light emitting diode device produced by the method.

2. Description of Related Art

A light emitting diode device is, for example, provided with an LED (a light emitting diode element) which is mounted on the upper surface of a board and emits blue light, a phosphor layer which is capable of converting the blue light into yellow light and is provided on the LED, and an encapsulating layer which encapsulates the LED. The light emitting diode device emits high-energy white light by color mixing of the blue light, which is emitted from the LED that is encapsulated by the encapsulating layer and transmits through the phosphor layer, and the yellow light, which is converted in wavelength from a part of the blue light in the phosphor layer.

As a method for producing the light emitting diode device, the following method has been proposed (ref: for example, Japanese Unexamined Patent Publications No. 2009-60031 and No. 2010-123802).

That is, in Japanese Unexamined Patent Publication No. 2009-60031, first, an integrated-type encapsulating sheet is prepared. The integrated-type encapsulating sheet includes a resin sheet A (a first layer) that is prepared from an epoxy resin and is formed with a hole and a resin layer B (a second layer) that is formed by pouring a silicone varnish containing a phosphor and a silicone gel into the hole in the resin sheet A. Next, the integrated-type encapsulating sheet is laminated on a board on which an LED element is mounted so that the second layer is brought into contact with the LED element to be subsequently subjected to a thermal compression bonding and then, a post curing. In this manner, an optical semiconductor device is obtained.

Also, in Japanese Unexamined Patent Publication No. 2010-123802, first, a first resin layer which is prepared and formed from a solution containing a phosphor and a silicone elastomer is laminated on the entire surface of a second resin layer which is prepared and formed from a silicone resin solution, so that a semiconductor encapsulating sheet is prepared. Next, the semiconductor encapsulating sheet is put on a board on which an LED chip is mounted so that the second resin layer in the semiconductor encapsulating sheet is brought into contact with the LED chip to be subsequently subjected to a thermal compression bonding and then, a post curing. In this manner, an optical semiconductor device is obtained.

SUMMARY OF THE INVENTION

However, in the optical semiconductor device in Japanese Unexamined Patent Publication No. 2009-60031, when the LED element is allowed to light up for a long time, there may be a case where a crack or coloring (to be specific, yellowing) occurs in the resin sheet A in the integrated-type encapsulating sheet or furthermore, a peeling occurs between the resin sheet A and the resin layer B.

In Japanese Unexamined Patent Publication No. 2010-123802, the first resin layer containing the phosphor is laminated on the entire surface of the second resin layer to prepare the semiconductor encapsulating sheet. Therefore, the mixing amount of the phosphor in one piece of the semiconductor encapsulating sheet is increased and thus, the production cost of the semiconductor encapsulating sheet is increased, leading to an increase in the production cost of the optical semiconductor device.

On the other hand, there is a disadvantage that when the mixing amount of the phosphor in one piece of the semiconductor encapsulating sheet is reduced, the concentration of the phosphor around the LED chip is reduced, so that unevenness in chromaticity of the light emitted from the LED chip is increased.

It is an object of the present invention to provide an encapsulating sheet which is capable of suppressing a crack and coloring in a transparent layer and suppressing a peeling between the transparent layer and a phosphor encapsulating layer and in which the production cost is reduced, a method for producing a light emitting diode device which uses the encapsulating sheet, and a light emitting diode device which is produced by the method and in which the unevenness in chromaticity is reduced.

An encapsulating sheet of the present invention includes a transparent layer in which a concave portion that is dented from the surface inwardly is formed and a phosphor encapsulating layer which fills the concave portion, wherein the transparent layer is formed from a transparent composition containing a first silicone resin composition and the phosphor encapsulating layer is formed from a phosphor encapsulating composition containing a phosphor and a second silicone resin composition.

In the encapsulating sheet of the present invention, it is preferable that the first silicone resin composition and/or the second silicone resin composition are/is a thermosetting silicone resin composition.

In the encapsulating sheet of the present invention, it is preferable that the thermosetting silicone resin composition is a thermosetting silicone resin composition before final curing.

In the encapsulating sheet of the present invention, it is preferable that the thermosetting silicone resin composition before final curing in the transparent layer is a first-step cured material of a two-step curable type silicone resin composition.

In the encapsulating sheet of the present invention, it is preferable that the thermosetting silicone resin composition before final curing in the phosphor encapsulating layer is a first-step cured material of a two-step curable type silicone resin composition and/or a thermoplastic material of a silicone resin composition having both thermoplastic properties and thermosetting properties.

A method for producing a light emitting diode device of the present invention, allowing encapsulation of a light emitting diode element by an encapsulating sheet, includes the steps of preparing the above-described encapsulating sheet and embedding the light emitting diode element in the phosphor encapsulating layer in the encapsulating sheet.

A light emitting diode device of the present invention is produced by the above-described method for producing a light emitting diode device.

In the encapsulating sheet of the present invention, the method for producing a light emitting diode device of the present invention using the encapsulating sheet, and the light emitting diode device of the present invention produced by the method, the transparent layer is formed from the transparent composition containing the first silicone resin composition, so that a crack and coloring in the transparent layer can be suppressed.

The transparent layer is formed from the transparent composition containing the first silicone resin composition and the phosphor encapsulating layer is formed from the phosphor encapsulating composition containing the second silicone resin composition, so that the affinity between the transparent layer and the phosphor encapsulating layer is high and therefore, a peeling therebetween can be suppressed.

The phosphor encapsulating layer is, in the concave portion formed in the transparent layer, formed from the phosphor encapsulating composition containing the phosphor. The light emitting diode element is embedded by the phosphor encapsulating layer, so that the mixing amount of the phosphor in the phosphor encapsulating layer in which the light emitting diode element is embedded is sufficiently ensured and light emitted from the light emitting diode element can be surely converted, while the mixing amount of the phosphor in the encapsulating sheet can be reduced, compared with that in a case where the phosphor encapsulating layer is formed on the entire surface of the transparent layer.

Therefore, the production cost of the encapsulating sheet can be reduced.

As a result, in the method for producing a light emitting diode device using the encapsulating sheet, the production cost of the light emitting diode device can be reduced.

(a) illustrating a plan view and (b) illustrating a sectional view along the A-A line.

Figure 2:
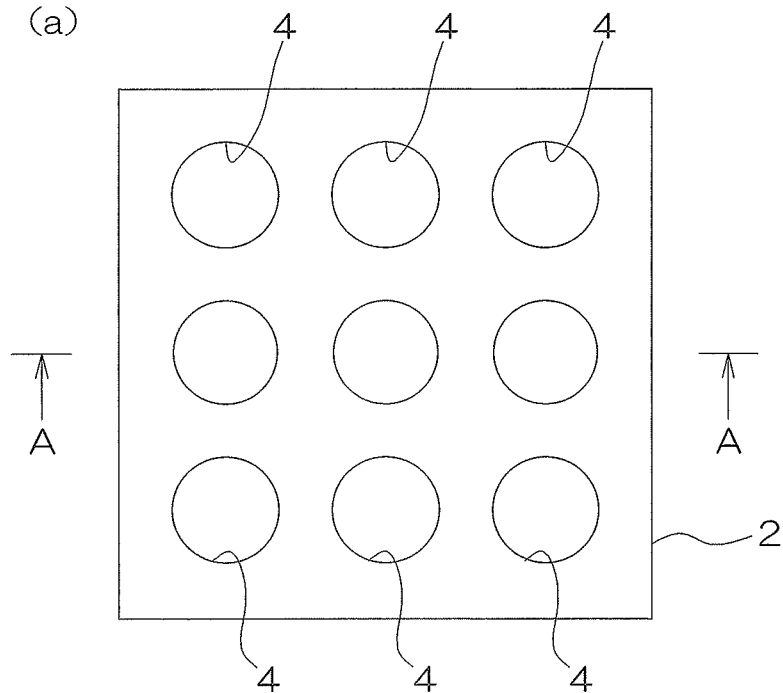
FIG. 2 shows a transparent layer in the encapsulating sheet shown in FIG. 1.
Figure 2:
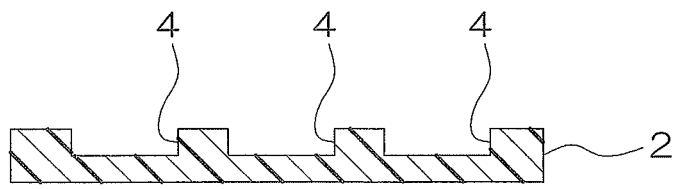
Figure 3:
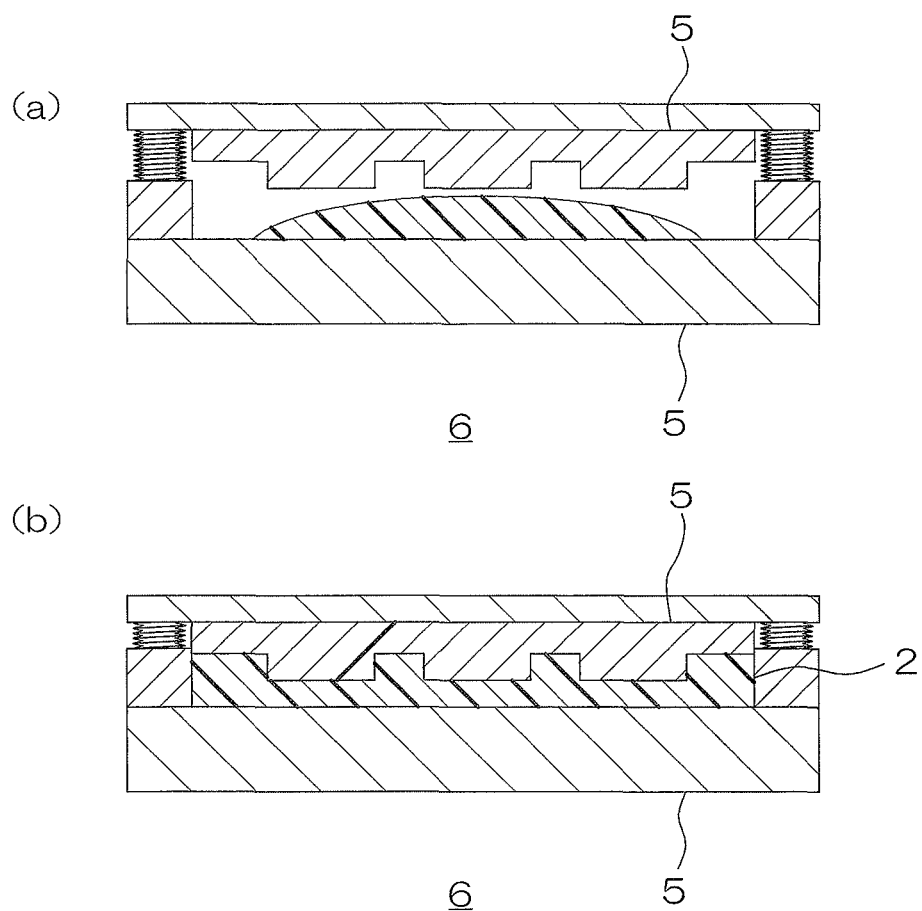

FIG. 3 shows views for illustrating a method (a compression molding method) for fabricating the transparent layer shown in FIG. 2:

(a) illustrating a step of charging a transparent composition into a compression molding machine and (b) illustrating a step of closing a mold die.

Figure 4:
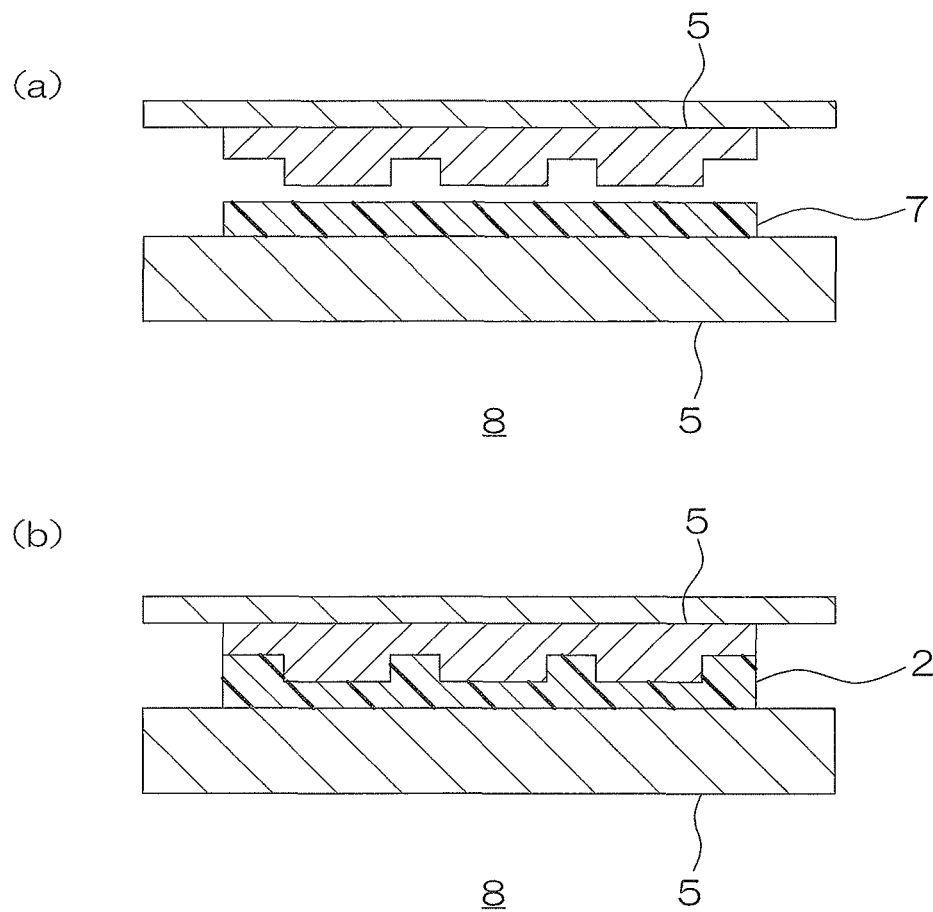

FIG. 4 shows views for illustrating a method (a thermal pressing method) for fabricating the transparent layer shown in FIG. 2:

(a) illustrating a step of setting a transparent sheet into a thermal pressing machine and (b) illustrating a step of conducting thermal pressing.

Figure 5:
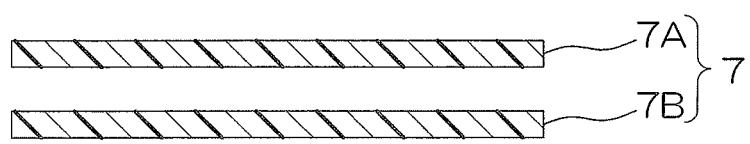
Figure 5:
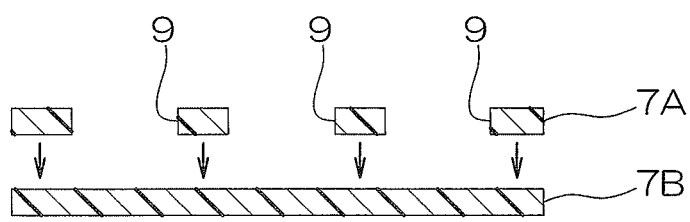
Figure 5:
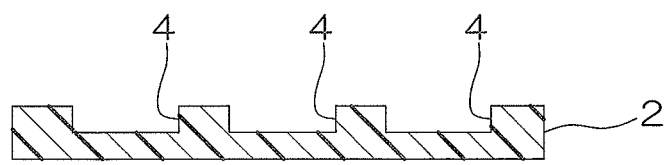

FIG. 5 shows views for illustrating a method (a laminating method) for fabricating the transparent layer shown in FIG. 2:

(a) illustrating a step of preparing two pieces of the transparent sheets, (b) illustrating a step of forming through holes in one piece of the transparent sheet, and (c) illustrating a step of attaching the two pieces of the transparent sheets.

Figure 6:
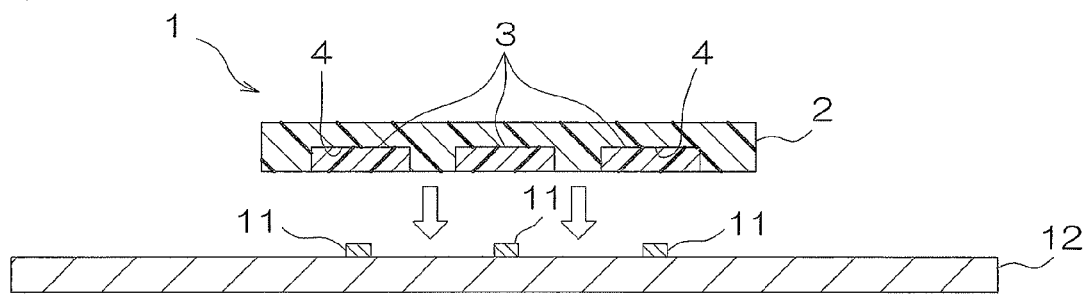
Figure 6:
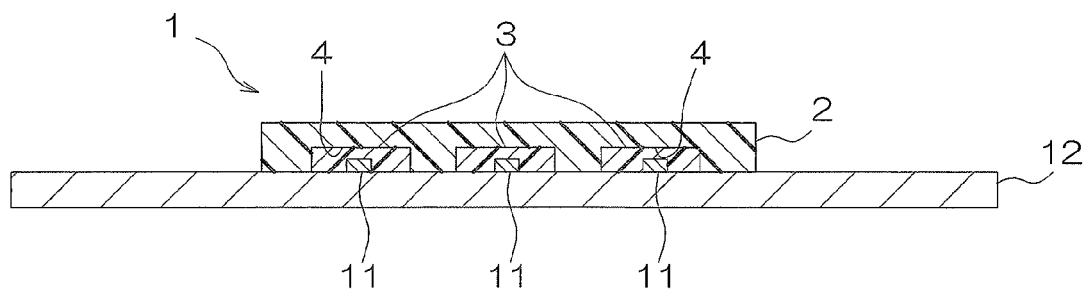

FIG. 6 shows views for illustrating a method for producing one embodiment of the encapsulating sheet of the present invention:

(a) illustrating a step of disposing the encapsulating sheet on a board and (b) illustrating a step of compressively bonding the encapsulating sheet with respect to the board.

FIG. 7 shows a plan view of the board shown in FIG. 6 (a).

DETAILED DESCRIPTION OF THE INVENTION

Figure 1:
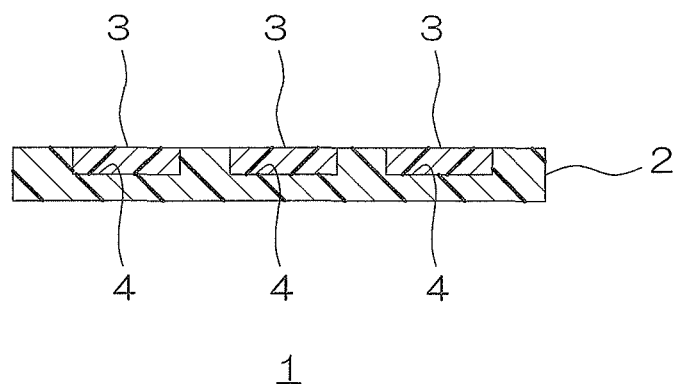
FIG. 1 shows a sectional view of one embodiment of an encapsulating sheet of the present invention.

FIG. 1 shows a sectional view of one embodiment of an encapsulating sheet of the present invention. FIG. 2 shows a transparent layer in the encapsulating sheet shown in FIG. 1: (a) illustrating a plan view and (b) illustrating a sectional view along the A-A line. FIG. 3 shows views for illustrating a method (a compression molding method) for fabricating the transparent layer shown in FIG. 2: (a) illustrating a step of charging a transparent composition into a compression molding machine and (b) illustrating a step of closing a mold die. FIG. 4 shows views for illustrating a method (a thermal pressing method) for fabricating the transparent layer shown in FIG. 2: (a) illustrating a step of setting a transparent sheet into a thermal pressing machine and (b) illustrating a step of conducting thermal pressing. FIG. 5 shows views for illustrating a method (a laminating method) for fabricating the transparent layer shown in FIG. 2: (a) illustrating a step of preparing two pieces of the transparent sheets, (b) illustrating a step of forming through holes in one piece of the transparent sheet, and (c) illustrating a step of attaching the two pieces of the transparent sheets.

In FIG. 1, an encapsulating sheet 1 includes a transparent layer 2 and phosphor encapsulating layers 3.

As shown in FIGS. 2 (a) and 2 (b), the transparent layer 2 is formed into a sheet shape and on the top side of the transparent layer 2, concave portions 4 which are dented from the surface inwardly in the thickness direction are formed.

The concave portions 4 are disposed in alignment at spaced intervals to each other in the plane direction (a direction perpendicular to the thickness direction) of the transparent layer 2. Each of the concave portions 4 is open upwardly, and is formed into a generally circular shape in plane view and into a generally rectangular shape in sectional view.

The size of each of the concave portions 4 is appropriately set in accordance with the arrangement and the size of light emitting diode elements 11 (described later, ref: FIGS. 6 (b) and 7). To be specific, the size of each of the concave portions 4 is as follows: an inner diameter (the maximum length in the plane direction) of, for example, 0.5 to 10 mm, or preferably 1 to 5 mm and a depth (a length in the thickness direction) of, in view of protecting the light emitting diode elements 11 (and wires in a case where the light emitting diode elements 11 are wire-bonding connected to a board 12 (described later)), for example, 0.02 to 1.0 mm, or preferably 0.05 to 0.5 mm. The gap (the closest gap) between the concave portions 4 is, for example, 0.5 to 10 mm, or preferably 1 to 5 mm.

The thickness of the transparent layer 2, that is, the thickness of the transparent layer 2 around the concave portions 4 is, in view of handling ability, for example, 0.05 to 5.0 mm, or preferably 0.1 to 2.0 mm.

The transparent layer 2 is formed from a transparent composition containing a first silicone resin composition.

An example of the first silicone resin composition includes a thermosetting silicone resin composition such as a two-step curable type silicone resin composition and a one-step curable type silicone resin composition.

The two-step curable type silicone resin composition is defined as a thermosetting silicone resin composition which has a two-step reaction mechanism and in which a silicone resin composition is brought into a B-stage state (a semi-cured state) in the first-step reaction and is brought into a C-stage state (a final curing state) in the second-step reaction.

The B-stage state is a state between an A-stage state in which a silicone resin composition is soluble in a solvent and a C-stage state in which a silicone resin composition is subjected to a final curing. Also, the B-stage state is a state in which the curing and the gelation of the silicone resin composition are slightly progressed to be swollen but not to be completely dissolved in a solvent and also to be softened but not to be melted by heating.

On the other hand, the one-step curable type silicone resin composition is defined as a thermosetting silicone resin composition which has a one-step reaction mechanism and in which a silicone resin composition is subjected to a final curing in the first-step reaction.

An example of an uncured material (before cuing in the first step) of the two-step curable type silicone resin composition includes a condensation reaction and addition reaction curable type silicone resin composition.

The condensation reaction and addition reaction curable type silicone resin composition is a thermosetting silicone resin composition which can be subjected to a condensation reaction and an addition reaction by heating. To be specific, the condensation reaction and addition reaction curable type silicone resin composition is a thermosetting silicone resin composition which can be subjected to a condensation reaction to be brought into a B-stage state (a semi-cured state) by heating and then, be subjected to an addition reaction (to be specific, for example, a hydrosilylation reaction) to be brought into a C-stage state (a final curing state) by further heating.

Examples of the condensation reaction and addition reaction curable type silicone resin composition include a first condensation reaction and addition reaction curable type silicone resin composition which contains a polysiloxane containing silanol groups at both ends, an alkenyl group-containing trialkoxysilane, an organohydrogensiloxane, a condensation catalyst, and a hydrosilylation catalyst; a second condensation reaction and addition reaction curable type silicone resin composition which contains a polysiloxane containing silanol groups at both ends, a silicon compound containing an ethylenically unsaturated hydrocarbon group (hereinafter, defined as an ethylenic silicon compound), an epoxy group-containing silicon compound, an organohydrogensiloxane, a condensation catalyst, and an addition catalyst (a hydrosilylation catalyst); a third condensation reaction and addition reaction curable type silicone resin composition which contains a silicone oil containing silanol groups at both ends, an alkenyl group-containing dialkoxyalkylsilane, an organohydrogensiloxane, a condensation catalyst, and a hydrosilylation catalyst; a fourth condensation reaction and addition reaction curable type silicone resin composition which contains an organopolysiloxane having, in one molecule, at least two alkenylsilyl groups, an organopolysiloxane having, in one molecule, at least two hydrosilyl groups, a hydrosilylation catalyst, and a curing retarder; a fifth condensation reaction and addition reaction curable type silicone resin composition which contains a first organopolysiloxane having, in one molecule, both at least two ethylenically unsaturated hydrocarbon groups and at least two hydrosilyl groups, a second organopolysiloxane having, in one molecule, at least two hydrosilyl groups without containing an ethylenically unsaturated hydrocarbon group, a hydrosilylation catalyst, and a hydrosilylation retarder; a sixth condensation reaction and addition reaction curable type silicone resin composition which contains a first organopolysiloxane having, in one molecule, both at least two ethylenically unsaturated hydrocarbon groups and at least two silanol groups, a second organopolysiloxane having, in one molecule, at least two hydrosilyl groups without containing an ethylenically unsaturated hydrocarbon group, a hydrosilylation retarder, and a hydrosilylation catalyst; a seventh condensation reaction and addition reaction curable type silicone resin composition which contains a silicon compound, and a boron compound or an aluminum compound; and an eighth condensation reaction and addition reaction curable type silicone resin composition which contains a polyaluminosiloxane and a silane coupling agent.

These condensation reaction and addition reaction curable type silicone resin compositions can be used alone or in combination of two or more.

As the condensation reaction and addition reaction curable type silicone resin composition, preferably, a second condensation reaction and addition reaction curable type silicone resin composition is used.

In the second condensation reaction and addition reaction curable type silicone resin composition, the polysiloxane containing silanol groups at both ends, the ethylenic silicon compound, and the epoxy group-containing silicon compound are condensation materials (materials subjected to a condensation reaction) and the ethylenic silicon compound and the organohydrogensiloxane are addition materials (materials subjected to an addition reaction).

The polysiloxane containing silanol groups at both ends is an organosiloxane which contains silanol groups (SiOH groups) at both ends of a molecule and to be specific, is represented by the following general formula (1).

General Formula (1):

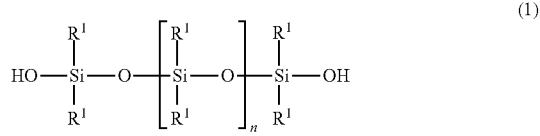

(where, in general formula (1), $R^1$ represents a monovalent hydrocarbon group selected from a saturated hydrocarbon group and an aromatic hydrocarbon group. "n" represents an integer of 1 or more.)

In the above-described general formula (1), in the monovalent hydrocarbon group represented by $R^1$, examples of the saturated hydrocarbon group include a straight chain or branched chain alkyl group having 1 to 6 carbon atoms (such as a methyl group, an ethyl group, a propyl group, an isopropyl group, a butyl group, an isobutyl group, a pentyl group, and a hexyl group) and a cycloalkyl group having 3 to 6 carbon atoms (such as a cyclopentyl group and a cyclohexyl group).

In the above-described general formula (1), in the monovalent hydrocarbon group represented by $R^1$, an example of the aromatic hydrocarbon group includes an aryl group having 6 to 10 carbon atoms (such as a phenyl group and a naphthyl group).

In the above-described general formula (1), $R^1$s may be the same or different from each other. Preferably, $R^1$s are the same.

As the monovalent hydrocarbon group, preferably, an alkyl group having 1 to 6 carbon atoms and an aryl group having 6 to 10 carbon atoms are used, or more preferably, in view of transparency, thermal stability, and light resistance, a methyl group is used.

In the above-described general formula (1), "n" is preferably, in view of stability and/or handling ability, an integer of 1 to 10000, or more preferably an integer of 1 to 1000.

"n" in the above-described general formula (1) is calculated as an average value.

To be specific, examples of the polysiloxane containing silanol groups at both ends include a polydimethylsiloxane containing silanol groups at both ends, a polymethylphenylsiloxane containing silanol groups at both ends, and a polydiphenylsiloxane containing silanol groups at both ends.

These polysiloxanes containing silanol groups at both ends can be used alone or in combination.

Of the polysiloxanes containing silanol groups at both ends, preferably, a polydimethylsiloxane containing silanol groups at both ends is used.

A commercially available product can be used as the polysiloxane containing silanol groups at both ends. A polysiloxane containing silanol groups at both ends synthesized in accordance with a known method can be also used.

The number average molecular weight of the polysiloxane containing silanol groups at both ends is, for example, in view of stability and/or handling ability, 100 to 1000000, or preferably 200 to 100000. The number average molecular weight is calculated by conversion based on standard polystyrene with a gel permeation chromatography. The number average molecular weight of a material, other than the polysiloxane containing silanol groups at both ends, to be described later, is also calculated in the same manner as the description above.

The silanol group equivalent in the polysiloxane containing silanol groups at both ends is, for example, 0.002 to 25 mmol/g, or preferably 0.02 to 25 mmol/g.

The mixing ratio of the polysiloxane containing silanol groups at both ends with respect to 100 parts by mass of the condensation material is, for example, 1 to 99.99 parts by mass, preferably 50 to 99.9 parts by mass, or more preferably 80 to 99.5 parts by mass.

The ethylenic silicon compound is a silane compound having both an ethylenically unsaturated hydrocarbon group and a leaving group in a silanol condensation reaction and to be specific, is represented by the following general formula (2).

General Formula (2):

$$R^2-Si(X^1)_3 \quad (2)$$

(where, in general formula (2), $R^2$ represents a monovalent ethylenically unsaturated hydrocarbon group. $X^1$ represents a halogen atom, an alkoxy group, a phenoxy group, or an acetoxy group. $X^1$s may be the same or different from each other.)

In the above-described general formula (2), examples of the ethylenically unsaturated hydrocarbon group represented by $R^2$ include a substituted or unsubstituted ethylenically unsaturated hydrocarbon group. Examples thereof include an alkenyl group and a cycloalkenyl group.

An example of the alkenyl group includes an alkenyl group having 2 to 10 carbon atoms such as a vinyl group, an allyl group, a propenyl group, a butenyl group, a pentenyl group, a hexenyl group, a heptenyl group, and an octenyl group.

An example of the cycloalkenyl group includes a cycloalkenyl group having 3 to 10 carbon atoms such as a cyclohexenyl group and a norbornenyl group.

As the ethylenically unsaturated hydrocarbon group, in view of reactivity with a hydrosilyl group, preferably, an alkenyl group is used, more preferably, an alkenyl group having 2 to 5 carbon atoms is used, or particularly preferably, a vinyl group is used.

$X^1$ in the above-described general formula (2) is a leaving group in the silanol condensation reaction. $SiX^1$ group in the above-described general formula (2) is a reactive functional group in the silanol condensation reaction.

In the above-described general formula (2), examples of the halogen atom represented by $X^1$ include bromine, chlorine, fluorine, and iodine.

In the above-described general formula (2), examples of the alkoxy group represented by $X^1$ include an alkoxy group containing a straight chain or branched chain alkyl group having 1 to 6 carbon atoms (such as a methoxy group, an ethoxy group, a propoxy group, an isopropoxy group, a butoxy group, an isobutoxy group, a pentyloxy group, and a hexyloxy group) and an alkoxy group containing a cycloalkyl group having 3 to 6 carbon atoms (such as a cyclopentyloxy group and a cyclohexyloxy group).

In the above-described general formula (2), $X^1$s may be the same or different from each other. Preferably, $X^1$s are the same.

Of the $X^1$s in the above-described general formula (2), preferably, an alkoxy group is used, or more preferably, a methoxy group is used.

Examples of the ethylenic silicon compound include a trialkoxysilane containing an ethylenically unsaturated hydrocarbon group, a trihalogenated silane containing an ethylenically unsaturated hydrocarbon group, a triphenoxysilane containing an ethylenically unsaturated hydrocarbon group, and a triacetoxysilane containing an ethylenically unsaturated hydrocarbon group.

These ethylenic silicon compounds can be used alone or in combination.

Of the ethylenic silicon compounds, preferably, a trialkoxysilane containing an ethylenically unsaturated hydrocarbon group is used.

To be specific, examples of the trialkoxysilane containing an ethylenically unsaturated hydrocarbon group include a vinyltrialkoxysilane such as a vinyltrimethoxysilane, a vinyltriethoxysilane, and a vinyltripropoxysilane; an allyltrimethoxysilane; a propenyltrimethoxysilane; a butenyltrimethoxysilane; and a cyclohexenyltrimethoxysilane.

Of the trialkoxysilanes containing an ethylenically unsaturated hydrocarbon group, preferably, a vinyltrialkoxysilane is used, or more preferably, a vinyltrimethoxysilane is used.

The mixing ratio of the ethylenic silicon compound with respect to 100 parts by mass of the condensation material is, for example, 0.01 to 90 parts by mass, preferably 0.01 to 50 parts by mass, or more preferably 0.01 to 10 parts by mass.

A commercially available product can be used as the ethylenic silicon compound. An ethylenic silicon compound synthesized in accordance with a known method can be also used.

The epoxy group-containing silicon compound is a silane compound having both an epoxy group and a leaving group in a silanol condensation reaction and to be specific, is represented by the following general formula (3).

General Formula (3):

$$R^3-Si(X^2)_3 \quad (3)$$

(where, in general formula (3), $R^3$ represents a group having an epoxy structure. $X^2$ represents a halogen atom, an alkoxy group, a phenoxy group, or an acetoxy group. $X^2$s may be the same or different from each other.)

In the above-described general formula (3), examples of the group having an epoxy structure represented by $R^3$ include an epoxy group, a glycidyl ether group, and an epoxycycloalkyl group such as an epoxycyclohexyl group.

Of the groups having an epoxy structure, preferably, a glycidyl ether group is used. To be specific, the glycidyl ether group is a glycidoxyalkyl group represented by the following general formula (4).

General Formula (4):

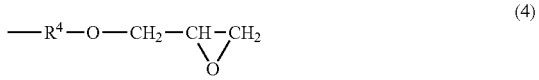

(4)

(where, in general formula (4), $R^4$ represents a divalent hydrocarbon group selected from a saturated hydrocarbon group and an aromatic hydrocarbon group.)

In the above-described general formula (4), in the divalent hydrocarbon group represented by $R^4$, examples of the saturated hydrocarbon group include an alkylene group having 1 to 6 carbon atoms (such as a methylene group, an ethylene group, a propylene group, and a butylene group) and a cycloalkylene group having 3 to 8 carbon atoms (such as a cyclopentylene group and a cyclohexylene group).

In the above-described general formula (4), in the divalent hydrocarbon group represented by $R^4$, an example of the aromatic hydrocarbon group includes an arylene group having 6 to 10 carbon atoms (such as a phenylene group and a naphthylene group).

As the divalent hydrocarbon group, preferably, an alkylene group having 1 to 6 carbon atoms is used, or more preferably, a propylene group is used.

To be specific, examples of the glycidyl ether group include a glycidoxymethyl group, a glycidoxyethyl group, a glycidoxypropyl group, a glycidoxycyclohexyl group, and a glycidoxyphenyl group.

Of the glycidyl ether groups, preferably, a glycidoxypropyl group is used.

$X^2$ in the above-described general formula (3) is a leaving group in the silanol condensation reaction. $SiX^2$ group in the above-described general formula (3) is a reactive functional group in the silanol condensation reaction.

In the above-described general formula (3), an example of the halogen atom represented by $X^2$ includes the same halogen atom as that represented by $X^1$ in the above-described general formula (2).

In the above-described general formula (3), an example of the alkoxy group represented by $X^2$ includes the same alkoxy group as that represented by $X^1$ in the above-described general formula (2).

In the above-described general formula (3), $X^2$s may be the same or different from each other. Preferably, $X^2$s are the same.

As $X^2$ in the above-described general formula (3), preferably, an alkoxy group is used, or more preferably, a methoxy group is used.

Examples of the epoxy group-containing silicon compound include an epoxy group-containing trialkoxysilane, an epoxy group-containing trihalogenated silane, an epoxy group-containing triphenoxysilane, and an epoxy group-containing triacetoxysilane.

These epoxy group-containing silicon compounds can be used alone or in combination.

Of the epoxy group-containing silicon compounds, preferably, an epoxy group-containing trialkoxysilane is used.

To be specific, examples of the epoxy group-containing trialkoxysilane include a glycidoxyalkyltrimethoxysilane such as a glycidoxymethyltrimethoxysilane, a (2-glycidoxyethyl)trimethoxysilane, and a (3-glycidoxypropyl)trimethoxysilane; a (3-glycidoxypropyl)triethoxysilane; a (3-glycidoxypropyl)tripropoxysilane; and a (3-glycidoxypropyl)triisopropoxysilane.

Of the epoxy group-containing trialkoxysilanes, preferably, a glycidoxyalkyltrimethoxysilane is used, or more preferably, a (3-glycidoxypropyl)trimethoxysilane is used.

The mixing ratio of the epoxy group-containing silicon compound with respect to 100 parts by mass of the condensation material is, for example, 0.01 to 90 parts by mass, preferably 0.01 to 50 parts by mass, or more preferably 0.01 to 1 parts by mass.

A commercially available product can be used as the epoxy group-containing silicon compound. An epoxy group-containing silicon compound synthesized in accordance with a known method can be also used.

The molar ratio ($SiOH/(SiX^1+SiX^2)$) of the silanol group (the SiOH group) in the polysiloxane containing silanol groups at both ends to the reactive functional group (the $SiX^1$ group and the $SiX^2$ group) in the ethylenic silicon compound and the epoxy group-containing silicon compound is, for example, 20/1 to 0.2/1, preferably 10/1 to 0.5/1, or more preferably substantially 1/1.

When the molar ratio exceeds the above-described upper limit, there may be a case where a material in a semi-cured state (a first-step cured material) having an appropriate toughness is not obtained when the second condensation reaction and addition reaction curable type silicone resin composition is brought into a semi-cured state. On the other hand, when the molar ratio is below the above-described lower limit, there may be a case where the mixing proportion of the ethylenic silicon compound and the epoxy group-containing silicon compound is excessively large, so that the heat resistance of the transparent layer 2 to be obtained is reduced.

When the molar ratio is within the above-described range (preferably, substantially 1/1), the silanol group (the SiOH group) in the polysiloxane containing silanol groups at both ends, and the reactive functional group (the $SiX^1$ group) in the ethylenic silicon compound and the reactive functional group (the $SiX^2$ group) in the epoxy group-containing silicon compound can be subjected to a condensation reaction neither too much nor too little.

The molar ratio of the ethylenic silicon compound to the epoxy group-containing silicon compound is, for example, 10/90 to 99/1, preferably 50/50 to 97/3, or more preferably 80/20 to 95/5.

When the molar ratio is within the above-described range, there is an advantage that the adhesive properties of a cured material (a two-step cured material) can be improved, while the strength thereof is ensured.

The organohydrogensiloxane is an organosiloxane having, in one molecule, at least two hydrosilyl groups without containing an ethylenically unsaturated hydrocarbon group.

To be specific, examples of the organohydrogensiloxane include an organopolysiloxane containing a hydrogen atom in its side chain and an organopolysiloxane containing hydrogen atoms at both ends.

The organopolysiloxane containing a hydrogen atom in its side chain is an organohydrogensiloxane having a hydrogen atom as a side chain that branches off from the main chain. Examples thereof include a methylhydrogenpolysiloxane, a dimethylpolysiloxane-co-methylhydrogenpolysiloxane, an ethylhydrogenpolysiloxane, and a methylhydrogenpolysiloxane-co-methylphenylpolysiloxane.

The number average molecular weight of the organopolysiloxane containing a hydrogen atom in its side chain is, for example, 100 to 1000000.

The organopolysiloxane containing hydrogen atoms at both ends is an organohydrogensiloxane having hydrogen atoms at both ends of the main chain. Examples thereof include a polydimethylsiloxane containing hydrosilyl groups at both ends, a polymethylphenylsiloxane containing hydrosilyl groups at both ends, and a polydiphenylsiloxane containing hydrosilyl groups at both ends.

The number average molecular weight of the organopolysiloxane containing hydrogen atoms at both ends is, for example, in view of stability and/or handling ability, 100 to 1000000, or preferably 100 to 100000.

These organohydrogensiloxanes can be used alone or in combination.

Of the organohydrogensiloxanes, preferably, an organopolysiloxane containing a hydrogen atom in its side chain is used, or more preferably, a dimethylpolysiloxane-co-methylhydrogenpolysiloxane is used.

The viscosity of the organohydrogensiloxane at 25° C. is, for example, 10 to 100000 mPa·s, or preferably 20 to 50000 mPa·s. The viscosity is measured with an E-type viscometer (type of rotor: 1"34'×$R^{24}$, a number of revolutions of 10 rpm). The viscosity of the material or the composition, other than the organohydrogensiloxane, to be described later is also calculated in the same manner as described above.

The hydrosilyl group equivalent in the organohydrogensiloxane is, for example, 0.1 to 30 mmol/g, or preferably 1 to 20 mmol/g.

A commercially available product can be used as the organohydrogensiloxane. An organohydrogensiloxane synthesized in accordance with a known method can be also used.

The mixing ratio of the organohydrogensiloxane with respect to 100 parts by mass of the ethylenic silicon compound is, though depending on the molar ratio of the ethylenically unsaturated hydrocarbon group ($R^2$ in the above-described general formula (2)) in the ethylenic silicon compound to the hydrosilyl group (the SiH group) in the organohydrogensiloxane, for example, 10 to 10000 parts by mass, or preferably 100 to 1000 parts by mass.

The molar ratio ($R^2$/SiH) of the ethylenically unsaturated hydrocarbon group ($R^2$ in the above-described general formula (2)) in the ethylenic silicon compound to the hydrosilyl group (the SiH group) in the organohydrogensiloxane is, for example, 20/1 to 0.05/1, preferably 20/1 to 0.1/1, more preferably 10/1 to 0.1/1, particularly preferably 10/1 to 0.2/1, or most preferably 5/1 to 0.2/1. The molar ratio thereof can be also set to be, for example, less than 1/1 and not less than 0.05/1.

When the molar ratio exceeds 20/1, there may be a case where a semi-cured material (a first-step cured material) having an appropriate toughness is not obtained when the second condensation reaction and addition reaction curable type silicone resin composition is brought into a semi-cured state. On the other hand, when the molar ratio is below 0.05/1, there may be a case where the mixing proportion of the organohydrogensiloxane is excessively large, so that the heat resistance and the toughness of the transparent layer 2 to be obtained are insufficient.

When the molar ratio is less than 1/1 and not less than 0.05/1, in allowing the second condensation reaction and addition reaction curable type silicone resin composition to be brought into a semi-cured state, the second condensation reaction and addition reaction curable type silicone resin composition can be quickly transferred into a semi-cured state with respect to the second condensation reaction and addition reaction curable type silicone resin composition whose molar ratio is 20/1 to 1/1.

The condensation catalyst is not particularly limited as long as it is a substance capable of improving the reaction rate of the condensation reaction of the silanol group with the reactive functional group (the $SiX^1$ group in the above-described general formula (2) and the $SiX^2$ group in the above-described general formula (3)). Examples of the condensation catalyst include an acid such as hydrochloric acid, acetic acid, formic acid, and sulfuric acid; a base such as potassium hydroxide, sodium hydroxide, potassium carbonate, and tetramethylammonium hydroxide; and a metal such as aluminum, titanium, zinc, and tin.

These condensation catalysts can be used alone or in combination.

Of the condensation catalysts, in view of compatibility and thermal decomposition properties, preferably, a base is used, or more preferably, tetramethylammonium hydroxide is used.

The mixing ratio of the condensation catalyst with respect to 100 mol of the polysiloxane containing silanol groups at both ends is, for example, 0.1 to 50 mol, or preferably 0.5 to 5 mol.

The addition catalyst is not particularly limited as long as it is a substance (a hydrosilylation catalyst) capable of improving the reaction rate of the addition reaction, that is, the hydrosilylation reaction of the ethylenically unsaturated hydrocarbon group with the SiH group. An example thereof includes a metal catalyst such as a platinum catalyst including platinum black, platinum chloride, chloroplatinic acid, a platinum olefin complex (for example, a platinum-divinylsiloxane complex and the like), a platinum carbonyl complex, and platinum acetyl acetate; a palladium catalyst; and a rhodium catalyst.

These addition catalysts can be used alone or in combination.

Of the addition catalysts, in view of compatibility, transparency, and catalyst activity, preferably, a platinum catalyst is used, or more preferably, a platinum carbonyl complex is used.

The mixing ratio of the addition catalyst, as a number of parts by mass of the metal amount in the addition catalyst, with respect to 100 parts by mass of the organohydrogensiloxane is, for example $1.0 \times 10^{-4}$ to 1.0 parts by mass, preferably $1.0 \times 10^4$ to 0.5 parts by mass, or more preferably $1.0 \times 10^{-4}$ to 0.05 parts by mass.

As the above-described catalyst, a catalyst in a solid state can be used as it is. Alternatively, in view of handling ability, a catalyst can be also used as a solution or as a dispersion liquid dissolved or dispersed in a solvent.

An example of the solvent includes an organic solvent such as an alcohol including methanol and ethanol; a silicon compound including siloxane; an aliphatic hydrocarbon including hexane; an aromatic hydrocarbon including toluene; and ether including tetrahydrofuran (THF). Also, an example of the solvent includes an aqueous solvent such as water.

As the solvent, when the catalyst is a condensation catalyst, preferably, an alcohol is used and when the catalyst is an addition catalyst, preferably, a silicon compound and an aromatic hydrocarbon are used.

The above-described polysiloxane containing silanol groups at both ends, ethylenic silicon compound, epoxy group-containing silicon compound, and organohydrogensiloxane are blended with catalysts (the condensation catalyst and the addition catalyst) to be stirred and mixed, so that the second condensation reaction and addition reaction curable type silicone resin composition is prepared.

In order to prepare the second condensation reaction and addition reaction curable type silicone resin composition, for example, the above-described materials (the condensation materials and the addition materials) and the catalysts can be blended simultaneously. Alternatively, each of the materials and each of the catalysts can be added, respectively, at different timings. Furthermore, a part of the components can be added simultaneously and each of the remaining components can be added, respectively, at different timings.

Of the preparing methods of the second condensation reaction and addition reaction curable type silicone resin composition, preferably, the following method is used. The condensation materials and the condensation catalyst are first added simultaneously. Next, the addition material is added thereto and thereafter, the addition catalyst is added thereto.

To be specific, the polysiloxane containing silanol groups at both ends, the ethylenic silicon compound, and the epoxy group-containing silicon compound (that is, the condensation materials) are simultaneously blended with the condensation catalyst at the above-described proportion to be stirred for, for example, 5 minutes to 24 hours.

At the time of blending and stirring, the temperature can be also adjusted to be, for example, 0 to 60° C., or preferably 10 to 40° C. so as to improve the compatibility and the handling ability of the condensation materials.

Thereafter, the pressure in the system (the above-described mixture) is reduced as required, so that a volatile component (an organic solvent) is removed.

Next, the organohydrogensiloxane is blended into the obtained mixture of the condensation materials and the condensation catalyst to be stirred for, for example, 1 to 120 minutes.

At the time of blending and stirring, the temperature can be also adjusted to be, for example, 0 to 60° C. so as to improve the compatibility and the handling ability of the mixture and the organohydrogensiloxane.

Thereafter, the addition catalyst is blended into the system (the above-described mixture) to be stirred for, for example, 1 to 60 minutes.

In this way, the second condensation reaction and addition reaction curable type silicone resin composition can be prepared.

The prepared second condensation reaction and addition reaction curable type silicone resin composition is, for example, in a liquid state (in an oil state) at normal temperature.

The viscosity of the second condensation reaction and addition reaction curable type silicone resin composition at 25° C. is, for example, 1000 to 50000 mPa·s, or preferably 4000 to 20000 mPa·s.

To be specific, the first condensation reaction and addition reaction curable type silicone resin composition is described in Japanese Unexamined Patent Publication No. 2010-285593 or the like and contains, for example, a polysiloxane containing silanol groups at both ends, a vinyltrimethoxysilane, an organohydrogensiloxane, tetramethylammonium hydroxide, and a platinum carbonyl complex. The second condensation reaction and addition reaction curable type silicone resin composition is described in Japanese Unexamined Patent Publication No. 2010-265436 or the like and contains, for example, a polydimethylsiloxane containing silanol groups at both ends, a vinyltrimethoxysilane, a (3-glycidoxypropyl)trimethoxysilane, an organohydrogensiloxane, tetramethylammonium hydroxide, and a platinum complex. The third condensation reaction and addition reaction curable type silicone resin composition is described in Japanese Unexamined Patent Publication No. 2011-149020 or the like and contains, for example, a silicone oil containing silanol groups at both ends, a vinyldimethoxymethylsilane, an organohydrogensiloxane, tetramethylammonium hydroxide, and a platinum carbonyl complex.

The fourth condensation reaction and addition reaction curable type silicone resin composition is described in Japanese Unexamined Patent Publication No. 2011-219597 or the like and contains, for example, a dimethylvinylsilyl-terminated polydimethylsiloxane, a trimethylsilyl-terminated dimethylsiloxane-methylhydrosiloxane copolymer, a platinum-divinyltetramethyldisiloxane complex, and tetramethylammonium hydroxide. The fifth condensation reaction and addition reaction curable type silicone resin composition contains, for example, a hydrogen-terminated vinylmethylsiloxane-dimethylsiloxane copolymer, a trimethylsiloxy-terminated dimethylsiloxane-methylhydrosiloxane copolymer, a platinum carbonyl complex, and tetramethylammonium hydroxide. The sixth condensation reaction and addition reaction curable type silicone resin composition contains, for example, a hydroxy-terminated vinylmethylsiloxane-dimethylsiloxane copolymer, a trimethylsiloxy-terminated dimethylsiloxane-methylhydrosiloxane copolymer, a platinum carbonyl complex, and tetramethylammonium hydroxide.

The seventh condensation reaction and addition reaction curable type silicone resin composition is described in Japanese Unexamined Patent Publication No. 2009-127021 or the like and contains, for example, a silicone oil containing silanol groups at both ends and triisopropyl borate. The eighth condensation reaction and addition reaction curable type silicone resin composition is described in Japanese Unexamined Patent Publication No. 2009-235376 or the like and contains, for example, a methacrylic silane coupling agent and a polyaluminosiloxane.

The condensation reaction and addition reaction curable type silicone resin composition is, for example, in a liquid state (in an oil state) at normal temperature and is heated, as described later, so that a condensation material therein is subjected to a condensation reaction to be brought into a B-stage state. That is, the condensation reaction and addition reaction curable type silicone resin composition is brought into a first-step cured material.

Thereafter, the condensation reaction and addition reaction curable type silicone resin composition in a B-stage state is further heated, so that an addition material therein is subjected to an addition reaction to be brought into a C-stage state (a final curing state). That is, the condensation reaction and addition reaction curable type silicone resin composition is brought into a two-step cured material.

An example of the one-step curable type silicone resin composition includes an addition reaction curable type silicone resin composition.

The addition reaction curable type silicone resin composition contains, for example, a polysiloxane containing an ethylenically unsaturated hydrocarbon group which serves as a main agent and an organohydrogensiloxane which serves as a cross-linking agent.

The polysiloxane containing an ethylenically unsaturated hydrocarbon group is a liquid polysiloxane which contains ethylenically unsaturated hydrocarbon groups at both ends or contains an ethylenically unsaturated hydrocarbon group in its side chain.

An example of the ethylenically unsaturated hydrocarbon group includes the above-described ethylenically unsaturated hydrocarbon group. Preferably, an alkenyl group is used, or more preferably, a vinyl group is used.

Examples of the polysiloxane containing an ethylenically unsaturated hydrocarbon group include an alkenyl group-containing polydimethylsiloxane, an alkenyl group-containing polymethylphenylsiloxane, and an alkenyl group-containing polydiphenylsiloxane.

These polysiloxanes containing an ethylenically unsaturated hydrocarbon group can be used alone or in combination.

An example of the organohydrogensiloxane includes the same organohydrogensiloxane as that described above.

These organohydrogensiloxanes can be used alone or in combination.

In the addition reaction curable type silicone resin composition, the polysiloxane containing an ethylenically unsaturated hydrocarbon group and the organohydrogensiloxane are usually provided in separate packages. To be specific, the addition reaction curable type silicone resin composition is provided as two liquids of A liquid which contains a main agent (the polysiloxane containing an ethylenically unsaturated hydrocarbon group) and B liquid which contains a cross-linking agent (the organohydrogensiloxane). A known catalyst which is necessary for the addition reaction of both components is added in the polysiloxane containing an ethylenically unsaturated hydrocarbon group.

As the addition reaction curable type silicone resin composition, a commercially available product (trade name: KER-2500, manufactured by Shin-Etsu Chemical Co., Ltd., trade name: LR-7665, manufactured by Asahikasei Silicone Co., Ltd.) can be used.

In the addition reaction curable type silicone resin composition, the main agent (A liquid) and the cross-linking agent (B liquid) are mixed to prepare a liquid mixture. In a step of forming the liquid mixture into the above-described shape of the transparent layer 2, the polysiloxane containing an ethylenically unsaturated hydrocarbon group and the organohydrogensiloxane are subjected to an addition reaction and the addition reaction curable type silicone resin composition is cured, so that a silicone elastomer (a cured material) is formed.

The first silicone resin composition is, for example, prepared from a thermosetting silicone resin composition before final curing or after final curing. Preferably, in view of improving the adhesive properties of the transparent layer 2 to the board 12 (ref: FIGS. 6 (b) and 7), the first silicone resin composition is prepared from a thermosetting silicone resin composition before final curing.

More preferably, when the thermosetting silicone resin composition is a two-step curable type silicone resin composition, the first silicone resin composition is a first-step cured material of the two-step curable type silicone resin composition and when the thermosetting silicone resin composition is a one-step curable type silicone resin composition, the first silicone resin composition is an uncured material (before curing) of the one-step curable type silicone resin composition.

Particularly preferably, the thermosetting silicone resin composition is formed as a first-step cured material of the two-step curable type silicone resin composition.

The mixing ratio of the first silicone resin composition with respect to a transparent composition is, for example, 50 mass % or more, or preferably 80 mass % or more, and is also 100 mass % or less.

A filler can be contained in the transparent composition as required.

Examples of the filler include silicone microparticles, glass, alumina, silica (fused silica, crystalline silica, ultrafine amorphous silica, hydrophobic ultrafine silica, and the like), titania, zirconia, talc, clay, and barium sulfate. These fillers can be used alone or in combination of two or more.

Preferably, silicone microparticles and silica are used.

The particle size of the filler is appropriately selected in accordance with its purpose and use. The average particle size (the average of the maximum length) thereof is, in view of transparency, for example, 20 μm or less, or preferably 10 μm or less.

The content ratio of the filler with respect to 100 parts by mass of the first silicone resin composition is, for example, 0.1 to 80 parts by mass, or preferably 1 to 50 parts by mass.

In addition, a known additive can be added to the transparent composition at an appropriate proportion. Examples of the known additive include modifiers, surfactants, dyes, pigments, discoloration inhibitors, and ultraviolet absorbers.

As shown in FIG. 1, the phosphor encapsulating layers 3 fill the concave portions 4. The upper surfaces of the phosphor encapsulating layers 3 are formed so as to be flush with the upper surface of the transparent layer 2 around the concave portions 4 in the plane direction. The size of each of the phosphor encapsulating layers 3 is set corresponding to the size of each of the concave portions 4.

The phosphor encapsulating layers 3 are formed from a phosphor encapsulating composition which contains a phosphor and a second silicone resin composition.

An example of the phosphor includes a yellow phosphor which is capable of converting blue light into yellow light. An example of the phosphor includes a phosphor obtained by doping a metal atom such as cerium (Ce) or europium (Eu) into a composite metal oxide, a metal sulfide, or the like.

To be specific, examples of the phosphor include a garnet type phosphor having a garnet type crystal structure such as $Y_3Al_5O_{12}$:Ce (YAG (yttrium aluminum garnet):Ce), (Y, Gd)$_3$Al$_5$O$_{12}$:Ce, Tb$_3$Al$_3$O$_{12}$:Ce, Ca$_3$Sc$_2$Si$_3$O$_{12}$:Ce, and Lu$_2$CaMg$_2$(Si, Ge)$_3$O$_{12}$:Ce; a silicate phosphor such as (Sr, Ba)$_2$SiO$_4$:Eu, Ca$_3$SiO$_4$Cl$_2$:Eu, Sr$_3$SiO$_5$:Eu, Li$_2$SrSiO$_4$:Eu, and Ca$_3$Si$_2$O$_7$:Eu; an aluminate phosphor such as CaAl$_{12}$O$_{19}$:Mn and SrAl$_2$O$_4$:Eu; a sulfide phosphor such as ZnS:Cu,Al, CaS:Eu, CaGa$_2$S$_4$:Eu, and SrGa$_2$S$_4$:Eu; an oxynitride phosphor such as CaSi$_2$O$_2$N$_2$:Eu, SrSi$_2$O$_2$N$_2$:Eu, BaSi$_2$O$_2$N$_2$:Eu, and Ca-α-SiAlON; a nitride phosphor such as CaAlSiN$_3$:Eu and CaSi$_5$N$_8$:Eu; and a fluoride-based phosphor such as K$_2$SiF$_6$:Mn and K$_2$TiF$_6$:Mn. Preferably, a garnet type phosphor is used, or more preferably, Y$_3$Al$_5$O$_{12}$:Ce is used.

The phosphor is in the form of a particle. The shape thereof is not particularly limited and examples of the shape thereof include a generally sphere shape, a generally flat plate shape, and a generally needle shape.

The average particle size (the average of the maximum length) of the phosphor is, for example, 0.1 to 30 μm, or preferably 0.2 to 20 μm. The average particle size of the phosphor particles is measured with a particle size distribution analyzer.

These phosphors can be used alone or in combination.

The mixing ratio of the phosphor with respect to 100 parts by mass of the second silicone resin composition is, for example, 0.1 to 80 parts by mass, or preferably 1 to 60 parts by mass.

An example of the second silicone resin composition includes a thermosetting silicone resin composition such as a two-step curable type silicone resin composition and a silicone resin composition having both thermoplastic properties and thermosetting properties (hereinafter, defined as a silicone resin composition having both thermoplastic and thermosetting properties).

An example of the two-step curable type silicone resin composition includes the same two-step curable type silicone resin composition as that illustrated in the first silicone resin composition. Preferably, a first-step cured material of the two-step curable type silicone resin composition is used.

The silicone resin composition having both thermoplastic and thermosetting properties is a thermosetting silicone resin composition which is once plasticized (or liquefied) by heating and thereafter, is cured by further heating.

Examples of the silicone resin composition having both thermoplastic and thermosetting properties include a first silicone resin composition having both thermoplastic and thermosetting properties which contains a silicone resin containing amino groups at both ends, an organohydrogensiloxane, a diisocyanate, and a hydrosilylation catalyst; a second silicone resin composition having both thermoplastic and thermosetting properties which contains a silicone resin containing amino groups at both ends, a diisocyanate, and a radical generator; a third silicone resin composition having both thermoplastic and thermosetting properties which contains a cage octasilsesquioxane having a hydrosilyl group, an alkenyl group-containing polysiloxane which contains an alkenyl group having a number of moles smaller than that of a hydrosilyl group in the cage octasilsesquioxane, and a hydrosilylation catalyst; a fourth silicone resin composition having both thermoplastic and thermosetting properties which contains a cage octasilsesquioxane having a hydrosilyl group, an alkenyl group-containing polysiloxane which contains an alkenyl group having a number of moles smaller than that of a hydrosilyl group in the cage octasilsesquioxane, a hydrosilylation catalyst, and a hydroxyl group-containing polysiloxane; a fifth silicone resin composition having both thermoplastic and thermosetting properties which contains a cage octasilsesquioxane having a hydrosilyl group, an alkenyl group-containing polysiloxane which contains an alkenyl group having a number of moles smaller than that of a hydrosilyl group in the cage octasilsesquioxane, a hydrosilylation catalyst, and an organohydrogenpolysiloxane; and a sixth silicone resin composition having both thermoplastic and thermosetting properties which contains a cage octasilsesquioxane, a straight chain polysiloxane containing alkenyl groups at both ends which contains alkenyl groups having a number of moles smaller than that of a hydrosilyl group in the cage octasilsesquioxane at both ends of a molecule, a hydrosilylation catalyst, and a polysiloxane containing alkenyl groups in its side chain which has two or more alkenyl groups in its side chain.

These silicone resin compositions having both thermoplastic and thermosetting properties can be used alone or in combination.

As the silicone resin composition having both thermoplastic and thermosetting properties, preferably, a sixth silicone resin composition having both thermoplastic and thermosetting properties is used.

In the sixth silicone resin composition having both thermoplastic and thermosetting properties, the cage octasilsesquioxane is an octamer of trifunctional silicone monomer and to be specific, has eight groups represented by the following formula (5),

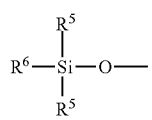
(5)

(where, in formula, $R^5$ represents a monovalent hydrocarbon group and $R^6$ represents hydrogen or a monovalent hydrocarbon group. The molar ratio of the monovalent hydrocarbon group: hydrogen in $R^6$ in the cage octasilsesquioxane as a whole is, as an average value, in the range of 6.5:1.5 to 5.5:2.5.)

To be more specific, the cage octasilsesquioxane is represented by the following formula (6).

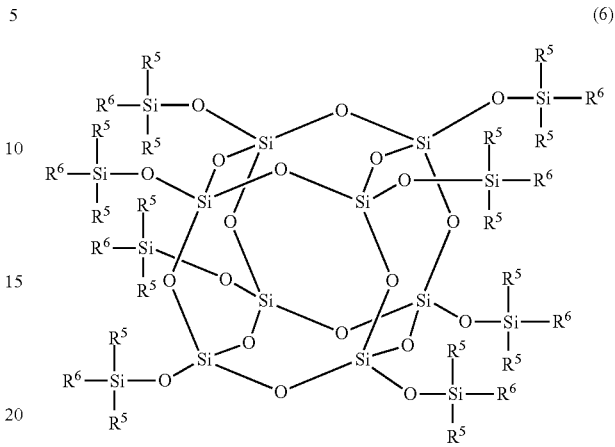
(6)

(where, in formula, $R^5$ and $R^6$ are the same as described above. The molar ratio of the monovalent hydrocarbon group: hydrogen in $R^6$ is the same as described above.)

In the above-described formulas (5) and (6), an example of the monovalent hydrocarbon group represented by $R^5$ includes the same monovalent hydrocarbon group as that illustrated by $R^1$ in the above-described formula (1).

In the above-described formulas (5) and (6), an example of the monovalent hydrocarbon group represented by $R^6$ includes the same monovalent hydrocarbon group as that represented by $R^5$ described above. Preferably, methyl is used.

The molar ratio of the monovalent hydrocarbon group: hydrogen in $R^6$ in formula (6), in the cage octasilsesquioxane as a whole, is in the range of 6.5:1.5 to 5.5:2.5, or preferably 6.0:2.0 to 5.5:2.5 as an average value.

That is, in one molecule of the cage octasilsesquioxane, the group represented by the above-described formula (5) forms 1.5 to 2.5 (to be specific, two), or preferably 2 to 2.5 (to be specific, two) of the hydrosilyl groups (—SiH).

When the above-described molar ratio of the monovalent hydrocarbon group: hydrogen in $R^6$ exceeds 6.5/1.5 (=6.5: 1.5) (for example, 7/1 (=7:1)), the number of moles of the hydrosilyl group is excessively small, so that the reactivity of the cage octasilsesquioxane with respect to the polysiloxane containing alkenyl groups at both ends (and the polysiloxane containing alkenyl groups in its side chain) is significantly reduced and the molecular weight of the sixth silicone resin composition having both thermoplastic and thermosetting properties to be obtained is reduced. Therefore, there may be a case where the sixth silicone resin composition having both thermoplastic and thermosetting properties in a solid state cannot be obtained.

On the other hand, when the above-described molar ratio of the monovalent hydrocarbon group: hydrogen in $R^6$ is below 5.5/2.5 (=5.5:2.5) (for example, 5/3 (=5:3)), the number of moles of the hydrosilyl group in the cage octasilsesquioxane is excessively large, so that the reactivity of the cage octasilsesquioxane with respect to the polysiloxane containing alkenyl groups at both ends (and the polysiloxane containing alkenyl groups in its side chain) is significantly increased. Therefore, the sixth silicone resin composition having both thermoplastic and thermosetting properties may not show the thermoplastic properties.

To be specific, an example of the above-described cage octasilsesquioxane includes a cage octasilsesquioxane having methyl in $R^5$ and methyl or hydrogen in $R^6$ in the above-described formulas (5) and (6) and having a molar ratio of methyl: hydrogen in $R^6$ in the cage octasilsesquioxane as a whole of 5.5:2.5, 6:2, or 6.5:1.5 as an average value.

The cage octasilsesquioxane represented by the above-described formula (6) is synthesized by, for example, a known method (for example, in conformity with the description in Japanese Unexamined Patent Publication No. 2007-246880).

To be specific, tetraalkoxysilane (tetraethoxysilane or the like) is allowed to react with an alcohol such as methanol and/or water in the presence of a catalyst to synthesize an octa(silsesquioxane) skeleton (a portion in formula (6) excluding the groups in formula (5)) and thereafter, dialkylchlorosilane (dimethylchlorosilane or the like) and trialkylchlorosilane (trimethylchlorosilane or the like) are blended at a mixing proportion corresponding to the above-described molar ratio of the monovalent hydrocarbon group: hydrogen in $R^6$, so that an alkoxyl group (ethoxy or the like) bonded to a silicon atom of the octa(silsesquioxane) skeleton is allowed to react with the dialkylchlorosilane and the trialkylchlorosilane. After the reaction, a reacting product is refined as required. In this way, the cage octasilsesquioxane can be obtained.

A commercially available product can be also used as the cage octasilsesquioxane.

The polysiloxane containing alkenyl groups at both ends is a straight chain polysiloxane which contains alkenyl groups at both ends of a molecule. To be specific, the polysiloxane containing alkenyl groups at both ends is represented by the following formula (7).

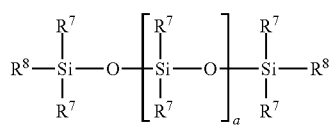

(7)

(where, in formula, $R^7$ represents a monovalent hydrocarbon group. $R^8$ represents an alkenyl group. "a" represents an integer of 1 or more.)

The monovalent hydrocarbon groups represented by $R^7$ in formula (7) may be the same or different from each other. Preferably, the monovalent hydrocarbon groups represented by $R^7$ are the same.

An example of the monovalent hydrocarbon group represented by $R^7$ includes the same monovalent hydrocarbon group as that represented by $R^5$ in the above-described formulas (5) and (6). Preferably, methyl and phenyl are used, or more preferably, methyl is used.

Examples of the alkenyl group represented by $R^8$ in formula (7) include a substituted or unsubstituted alkenyl group. Preferably, an unsubstituted alkenyl group is used.

An example of the alkenyl group includes an alkenyl group having 2 to 10 carbon atoms such as vinyl, allyl, propenyl, butenyl, and pentenyl.

The number of carbon atoms of the alkenyl group is, for example, 2 to 10, or preferably 2 to 5.

$R^8$s may be the same or different from each other. Preferably, $R^8$s are the same.

As the alkenyl group, preferably, in view of reactivity with the hydrosilyl group in the cage octasilsesquioxane, an alkenyl group having 2 to 5 carbon atoms is used, or more preferably, vinyl is used.

"a" represents, in view of reactivity and stability, preferably an integer of 1 to 100, or more preferably an integer of 1 to 50.

The number average molecular weight of the polysiloxane containing alkenyl groups at both ends is, in view of stability and handling ability, for example, 100 to 8000, or preferably 300 to 5000.

The polysiloxane containing alkenyl groups at both ends is synthesized in accordance with, for example, a known method. A commercially available product (for example, manufactured by Gelest, Inc.) can be also used.

Examples of the hydrosilylation catalyst include a platinum catalyst such as platinum black, platinum chloride, chloroplatinic acid, a platinum olefin complex, a platinum carbonyl complex, and platinum acetyl acetate; a palladium catalyst; and a rhodium catalyst.

Of the hydrosilylation catalysts, preferably, in view of compatibility and transparency, a platinum catalyst is used, or more preferably, a platinum olefin complex is used. To be specific, a platinum-divinylsiloxane complex such as a platinum-1,3-divinyl-1,1,3,3-tetramethyldisiloxane complex is used.

The hydrosilylation catalyst may be prepared as a solution in a known solvent (such as toluene).

The polysiloxane containing alkenyl groups in its side chain is a polysiloxane which contains two or more alkenyl groups in its side chain. Examples of the polysiloxane containing alkenyl groups in its side chain include a straight chain siloxane-containing polysiloxane (a straight chain polysiloxane) which contains alkenyl groups as a side chain bonded to the main chain (a silicon atom thereof) that contains a straight chain siloxane portion (—Si—O—) and/or a branched chain siloxane-containing polysiloxane (a branched chain polysiloxane) which contains alkenyl groups bonded to the silicon atoms in branched chain siloxane portions.

To be specific, the straight chain siloxane-containing polysiloxane is represented by the following formula (8).

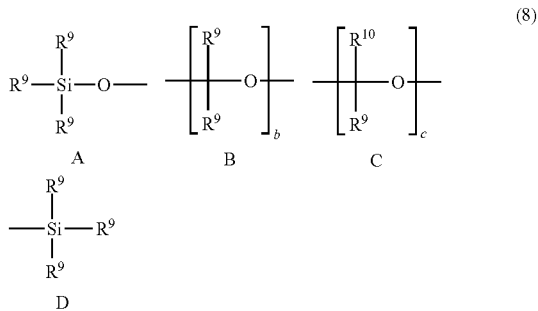

(8)

(where, in formula, A to D represent a constituent unit, A and D represent an end unit, and B and C represent a repeating unit. $R^9$ represents a monovalent hydrocarbon group and $R^{10}$ represents an alkenyl group. "b" represents an integer of 0 or 1 or more and "c" represents an integer of 2 or more.)

A to D constitute a straight chain siloxane-containing polysiloxane.

The monovalent hydrocarbon groups represented by $R^9$ in formula (8) may be the same or different from each other. Preferably, the monovalent hydrocarbon groups represented by $R^9$ are the same.

An example of the monovalent hydrocarbon group represented by $R^9$ includes the same monovalent hydrocarbon group as that represented by $R^5$ in the above-described formulas (5) and (6). Preferably, methyl and phenyl are used, or more preferably, methyl is used.

"b" represents, in view of reactivity and stability, preferably an integer of 1 to 10000, or more preferably an integer of 1 to 5000.

"c" represents, in view of reactivity and stability, preferably an integer of 2 to 500, more preferably an integer of 2 to 100.

The number average molecular weight of the straight chain siloxane-containing polysiloxane is, in view of stability and handling ability, for example, 200 to 1000000, or preferably 200 to 80000.

The content of the alkenyl group in the straight chain siloxane-containing polysiloxane is, for example, 0.01 to 10 mmol/g, or preferably 0.1 to 5 mmol/g. The content of the alkenyl group in the straight chain siloxane-containing polysiloxane is calculated by the area proportion of the alkenyl group to the methyl group with a $^1$H-NMR.

The straight chain siloxane-containing polysiloxane is synthesized in accordance with, for example, a known method. A commercially available product (for example, manufactured by Gelest, Inc.) can be also used.

To be specific, the branched chain siloxane-containing polysiloxane is represented by the following formula (9).

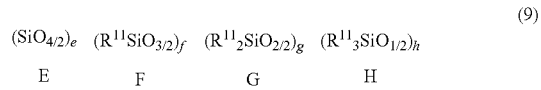

(9)

(where, in formula, E to H represent a constituent unit, E to G represent a repeating unit, and H represents an end unit. $R^{11}$ represents a monovalent hydrocarbon group. "e" represents an integer of 1 or more, "f" and "g" represent an integer of 0 or more, and "h" represents an integer of 4 or more. Furthermore, at least one $R^{11}$ per one molecule is an alkenyl group.)

E to H constitute a branched chain siloxane-containing polysiloxane.

The monovalent hydrocarbon group represented by $R^{11}$ is, for example, a saturated hydrocarbon group, an aromatic hydrocarbon group, or an unsaturated hydrocarbon group (excluding an aromatic hydrocarbon group).

An example of the saturated hydrocarbon group and the aromatic hydrocarbon group includes the same monovalent hydrocarbon group as that represented by $R^5$ in the above-described formulas (5) and (6). Preferably, methyl and phenyl are used, or more preferably, methyl is used.

An example of the unsaturated hydrocarbon group (excluding the aromatic hydrocarbon group) includes the same alkenyl group as that represented by $R^8$ in the above-described formula (7). Preferably, vinyl is used.

The monovalent hydrocarbon group represented by $R^{11}$ in formula (9) contains at least an alkenyl group, preferably contains an alkyl group and an alkenyl group, or more preferably contains a methyl group and a vinyl group.

The number of the alkenyl group in the branched chain siloxane-containing polysiloxane is 1 or more, or preferably 3 or more, and is usually 30 or less.

"e" represents preferably an integer of 1 to 100, or more preferably an integer of 1 to 50.

"f" represents preferably an integer of 1 to 100, or more preferably an integer of 1 to 50.

"g" represents preferably an integer of 1 to 100, or more preferably an integer of 1 to 50.

"h" represents preferably an integer of 1 to 100, or more preferably an integer of 1 to 30.

The number average molecular weight of the branched chain siloxane-containing polysiloxane is, in view of stability and handling ability, for example, 100 to 10000, or preferably 200 to 8000.

The content of the alkenyl group in the branched chain siloxane-containing polysiloxane is, for example, 0.01 to 100 mmol/g, or preferably 0.1 to 10 mmol/g. The content of the alkenyl group in the branched chain siloxane-containing polysiloxane is calculated by the area proportion of the alkenyl group to the methyl group with a $^1$H-NMR.

The branched chain siloxane-containing polysiloxane is synthesized in accordance with, for example, a known method. A commercially available product (for example, manufactured by Gelest, Inc.) can be also used.

The cage octasilsesquioxane, the polysiloxane containing alkenyl groups at both ends, the hydrosilylation catalyst, and the polysiloxane containing alkenyl groups in its side chain are blended, so that the sixth silicone resin composition having both thermoplastic and thermosetting properties is prepared.

The mixing ratio of the cage octasilsesquioxane with respect to the sixth silicone resin composition having both thermoplastic and thermosetting properties is, for example, 10 to 80 mass %, or preferably 10 to 70 mass %.

The mixing proportion of the polysiloxane containing alkenyl groups at both ends is adjusted so that the number of moles of the alkenyl group in the polysiloxane containing alkenyl groups at both ends is smaller than that of the hydrosilyl group in the cage octasilsesquioxane.

That is, the molar ratio (the number of moles of the alkenyl group/the number of moles of the hydrosilyl group) of the alkenyl group to the hydrosilyl group is below 1 and is, for example, 0.10 to 0.99, preferably 0.20 to 0.99, or more preferably 0.50 to 0.99. In other words, the mixing ratio of the polysiloxane containing alkenyl groups in its side chain with respect to 100 parts by mass of the total amount of the cage octasilsesquioxane and the polysiloxane containing alkenyl groups at both ends is, for example, 0.001 to 30 parts by mass, or preferably 0.01 to 20 parts by mass. The mixing ratio of the polysiloxane containing alkenyl groups in its side chain with respect to 100 parts by mass of the total amount of the cage octasilsesquioxane and the polysiloxane containing alkenyl groups at both ends can be also set to be, for example, 0.01 to 100 parts by mass, or preferably 0.1 to 50 parts by mass.

When the above-described molar ratio exceeds the above-described range, the hydrosilyl group is fewer than the alkenyl group. In such a case, the excess of the hydrosilyl group does not sufficiently remain after the reaction and the thermosetting properties may not be imparted to the sixth silicone resin composition having both thermoplastic and thermosetting properties.

On the other hand, when the above-described molar ratio is below the above-described range, the hydrosilyl group excessively remains and the cage octasilsesquioxanes themselves undergo hydrolysis by moisture in the air and a self-condensation reaction to be cured, so that flexibility may not be obtained.

The mixing ratio of the hydrosilylation catalyst (solid content) with respect to 100 parts by mass of the total amount of the cage octasilsesquioxane and the polysiloxane containing alkenyl groups at both ends is, for example, $1.0 \times 10^{-1}$ to 3 parts by mass, or preferably $1.0 \times 10^{-8}$ to 1 parts by mass.

The mixing ratio of the polysiloxane containing alkenyl groups in its side chain is adjusted so that the number of moles (X) of the alkenyl group with respect to the number of moles (Y), which is obtained by subtracting the number of moles of the alkenyl group in the polysiloxane containing alkenyl groups at both ends from the number of moles of the hydrosilyl group in the cage octasilsesquioxane, as the molar ratio (X/Y), is, for example, 0.001 to 1000, or preferably 0.01 to 100.

In order to prepare the sixth silicone resin composition having both thermoplastic and thermosetting properties, preferably, a silicone resin precursor, which is obtained by allowing the cage octasilsesquioxane to react with the polysiloxane containing alkenyl groups at both ends in the presence of the hydrosilylation catalyst, and the polysiloxane containing alkenyl groups in its side chain are blended.

That is, first, the cage octasilsesquioxane is allowed to react with the polysiloxane containing alkenyl groups at both ends in the presence of the hydrosilylation catalyst in such a mixing proportion that the number of moles of the hydrosilyl group in the cage octasilsesquioxane is larger (excessive) than that of the alkenyl group in the polysiloxane containing alkenyl groups at both ends. In this way, the silicone resin precursor is obtained.

To be more specific, in order to obtain the silicone resin precursor, the above-described cage octasilsesquioxane and the above-described polysiloxane containing alkenyl groups at both ends are blended at the above-described mixing proportion, along with the hydrosilylation catalyst, and the solvent as required, and thereafter, the mixture is heated as required.

Examples of the solvent include an aromatic hydrocarbon such as toluene, an aliphatic hydrocarbon such as hexane, and ester such as ethyl acetate. Preferably, in view of improving compatibility of each of the components, an aromatic hydrocarbon is used, or more preferably, toluene is used.

The reaction temperature is, for example, 0 to 100° C., or preferably 20 to 80° C. and the reaction duration is, for example, 0.5 to 96 hours.

In this way, the cage octasilsesquioxane is allowed to react with the polysiloxane containing alkenyl groups at both ends. That is, the hydrosilyl group in the cage octasilsesquioxane and the alkenyl group in the polysiloxane containing alkenyl groups at both ends are allowed to undergo the hydrosilylation reaction.

The degree of the hydrosilylation reaction of the hydrosilyl group in the cage octasilsesquioxane with the alkenyl group in the polysiloxane containing alkenyl groups at both ends can be checked by $^1$H-NMR measurement based on the intensity of a signal derived from the alkenyl group in the polysiloxane containing alkenyl groups at both ends. The hydrosilylation reaction is considered to be terminated at the time of disappearance of the signal.

In the above-described hydrosilylation reaction, the cage octasilsesquioxane is allowed to react with the polysiloxane containing alkenyl groups at both ends so that the number of moles of the hydrosilyl group is excessive compared with the number of moles of the alkenyl group. After the reaction, the excess of the hydrosilyl group remains.

In this way, the silicone resin precursor is obtained.

The silicone resin precursor is in a liquid state or in a semi-solid state.

Next, the obtained silicone resin precursor and the polysiloxane containing alkenyl groups in its side chain are blended at the above-described proportion. By the subsequent heating (described later), the silicone resin precursor is allowed to react with the polysiloxane containing alkenyl groups in its side chain. The solvent is distilled off as required.

In this way, the sixth silicone resin composition having both thermoplastic and thermosetting properties can be obtained.

The obtained sixth silicone resin composition having both thermoplastic and thermosetting properties is in a solid state. The sixth silicone resin composition having both thermoplastic and thermosetting properties in a solid state is obtained because the mobility of the polysiloxane containing alkenyl groups at both ends is reduced due to the steric hindrance of the cage octasilsesquioxane.

In the sixth silicone resin composition having both thermoplastic and thermosetting properties, the molar ratio of the monovalent hydrocarbon group: hydrogen in $R^6$ is within a specific range and therefore, in the cage octasilsesquioxane, the proportion of the hydrosilyl group to be reacted with the alkenyl group in the polysiloxane containing alkenyl groups at both ends is adjusted. Furthermore, the polysiloxane containing alkenyl groups at both ends is allowed to react with the cage octasilsesquioxane so that the alkenyl group thereof has the number of moles that is smaller than the number of moles of the hydrosilyl group in the cage octasilsesquioxane. Therefore, the obtained sixth silicone resin composition having both thermoplastic and thermosetting properties can have both the thermoplastic properties and the thermosetting properties, while having an excellent transparency and heat resistance.

That is, the sixth silicone resin composition having both thermoplastic and thermosetting properties is once plasticized (or liquefied) by the above-described heating and then, is thermally cured.

The thermoplastic temperature of the silicone resin composition having both thermoplastic and thermosetting properties is, for example, 40 to 150° C., or preferably 50 to 100° C. The thermoplastic temperature is the temperature at which the silicone resin composition having both thermoplastic and thermosetting properties shows the thermoplastic properties. To be specific, the thermoplastic temperature is the temperature at which the silicone resin composition having both thermoplastic and thermosetting properties in a solid state is softened by heating to be brought into a completely liquid state and is substantially the same as the softening temperature.

The thermosetting temperature of the silicone resin composition having both thermoplastic and thermosetting properties is, for example, 150 to 300° C., or preferably 180 to 250° C. or is, for example, 100 to 250° C., or preferably 120 to 250° C.

The first silicone resin composition having both thermoplastic and thermosetting properties is described in Japanese Unexamined Patent Publication No. 2011-148883 or the like and contains, for example, a silicone resin containing aminopropyl groups at both ends, an organohydrogensiloxane, tolylene 2,4-diisocyanate, and a platinum divinyl siloxane complex. The second silicone resin composition having both thermoplastic and thermosetting properties is described in Japanese Unexamined Patent Publication No. 2011-202099 or the like and contains, for example, a silicone resin containing amino groups at both ends, tolylene 2,4-diisocyanate, and di-t-butyl peroxide. The third silicone resin composition having both thermoplastic and thermosetting properties contains, for example, a cage octasilsesquioxane having a hydrosilyl group, an alkenyl group-containing polysiloxane, and a platinum divinyl siloxane complex. The fourth silicone resin composition having both thermoplastic and thermosetting properties contains, for example, a cage octasilsesquioxane having a hydrosilyl group, an alkenyl group-containing polysiloxane, a platinum divinyl siloxane complex, and a hydroxyl group-containing polysiloxane. The fifth silicone resin composition having both thermoplastic and thermosetting properties contains, for example, a cage octasilsesquioxane having a hydrosilyl group, an alkenyl group-containing polysiloxane, a platinum divinyl siloxane complex, and a side-chain type organohydrogenpolysiloxane. The sixth silicone resin composition having both thermoplastic and thermosetting properties contains, for example, a cage octasilsesquioxane having a hydrosilyl group, a polysiloxane containing alkenyl groups at both ends, a platinum divinyl siloxane complex, and a straight chain siloxane-containing polysiloxane.

The mixing ratio of the second silicone resin composition with respect to the phosphor encapsulating composition is, for example, 30 to 99.9 mass %, or preferably 40 to 90 mass %.

In order to prepare the phosphor encapsulating composition, the phosphor and the second silicone resin composition are blended. An additive illustrated in the transparent composition can be added to the phosphor encapsulating composition at an appropriate proportion.

When the second silicone resin composition is the two-step curable type silicone resin composition, preferably, the phosphor is added to the uncured material of the two-step curable type silicone resin composition to be uniformly mixed.

Also, when the second silicone resin composition is the silicone resin composition having both thermoplastic and thermosetting properties, preferably, the phosphor is added to the thermoplastic material of the silicone resin composition having both thermoplastic and thermosetting properties to be uniformly mixed.

In order to fabricate the encapsulating sheet 1 shown in FIG. 1, as shown in FIG. 2, first, the transparent layer 2 in which the concave portions 4 are formed is fabricated.

The transparent layer 2 is formed from the above-described transparent composition into the above-described shape by, for example, a thermal molding method (ref: FIGS. 3 and 4), a laminating method (ref: FIG. 5), or the like.

Examples of the thermal molding method include a method (a compression molding method) in which as shown in FIG. 3 (a), a liquid transparent composition is charged into a compression molding machine 6 including a mold die 5 corresponding to the concave portions 4 and subsequently, as shown in FIG. 3 (b), closing of the mold die 5 is performed with heating and a method (a thermal pressing method) in which a liquid transparent composition is applied onto a substrate (not shown) to form a transparent sheet 7, thereafter, as shown in FIG. 4 (a), the transparent sheet 7 is set into a thermal pressing machine 8 including the mold die 5 corresponding to the concave portions 4, and as shown in FIG. 4 (b), thermal pressing is conducted.

Examples of the substrate include a polyester film such as a polyethylene terephthalate (PET) film; a polycarbonate film; a polyolefin film such as a polyethylene film and a polypropylene film; a polystyrene film; an acrylic film; and a resin film such as a silicone resin film and a fluorine resin film. In addition, an example of the substrate also includes a metal foil such as a copper foil and a stainless steel foil.

Of the substrates, preferably, a resin film is used, or more preferably, a polyester film is used.

A release treatment is performed on the surface of the substrate as required.

The thickness of the substrate is, for example, in view of handling ability and cost, 10 to 200 μm, or preferably 20 to 100 μm.

In the laminating method, as shown in FIG. 5 (a), a liquid transparent composition is applied onto a substrate to form a plurality (for example, two pieces) of the transparent sheets 7. Thereafter, as shown in FIG. 5 (b), in one transparent sheet 7A, through holes 9 which correspond to the concave portions 4 and pass through the one transparent sheet 7A in the thickness direction are formed. Then, as shown in FIG. 5 (c), the one transparent sheet 7A and the other transparent sheet 7B are attached to each other.

In order to form the transparent layer 2 into the above-described shape, to be specific, when the transparent layer 2 is formed from a transparent composition containing a thermosetting silicone resin composition before final curing, to be more specific, when the transparent layer 2 is formed as a first-step cured material of a two-step curable type silicone resin composition, for example, a compression molding method, a thermal pressing method, or a laminating method is used. Preferably, a laminating method is used.

In order to form the transparent layer 2 as the first-step cured material of the two-step curable type silicone resin composition by the compression molding method, first, as shown in FIG. 3 (a), a liquid transparent composition containing an uncured material of a two-step curable type silicone resin composition is charged into the compression molding machine 6 and subsequently, as shown in FIG. 3 (b), closing of the mold die 5 is performed with heating, so that the two-step curable type silicone resin composition is brought into a first-step cured material and the transparent layer 2 which is prepared from the transparent composition containing the first-step cured material is fabricated.

In the compression molding machine, the pressure is, for example, 0.1 to 30 MPa, or preferably 1 to 10 MPa; the temperature is, for example, 80 to 200° C., or preferably 100 to 150° C.; and the duration is, for example, 1 to 300 minutes, or preferably 5 to 30 minutes.

In order to form the transparent layer 2 as the first-step cured material of the two-step curable type silicone resin composition by the thermal pressing method, a liquid transparent composition containing an uncured material of a two-step curable type silicone resin composition is applied onto a substrate (not shown) to be then heated, so that the two-step curable type silicone resin composition is brought into a first-step cured material. In this way, the transparent sheet 7 (a B-stage sheet, ref: FIG. 4 (a)) which is prepared from the transparent composition containing the first-step cured material is formed. Thereafter, as shown in FIG. 4 (a), the transparent sheet 7 is set into the thermal pressing machine 8 and then, as shown in FIG. 4 (b), thermal pressing is conducted, so that the transparent layer 2 is fabricated.

In order to apply the liquid transparent composition to the substrate, an application method such as a doctor blade method, a gravure coater method, or a fountain coater method is used.

The heating temperature of the transparent composition after application is, for example, 40 to 150° C., or preferably 80 to 150° C. The heating duration thereof is, for example, 1 minute to 24 hours, or preferably 1 minute to 1 hour.

The pressure in the thermal pressing machine 8 is, for example, 0.1 to 30 MPa, or preferably 1 to 10 MPa; the temperature is, for example, 80 to 200° C., or preferably 100 to 150° C.; and the pressing duration is, for example, 0.5 to 60 minutes, or preferably 1 to 30 minutes.

In order to form the transparent layer 2 as the first-step cured material of the two-step curable type silicone resin composition by the laminating method, a transparent composition containing an uncured material of a two-step curable type silicone resin composition is applied onto a substrate to be then heated, so that as shown in FIG. 5 (a), the two-step curable type silicone resin composition is brought into a first-step cured material and two pieces of the transparent sheets 7 which are prepared from the transparent composition containing the first-step cured material are formed. The fabrication conditions of the transparent sheets are the same as those of the thermal pressing method. Thereafter, as shown in FIG. 5 (b), in the one transparent sheet 7A, the through holes 9 are formed. Then, as shown in FIG. 5 (c), the one transparent sheet 7A and the other transparent sheet 7B are attached to each other using, for example, a laminator or the like.

In addition, when the transparent layer 2 is formed from a thermosetting silicone resin composition after final curing, to be more specific, when the transparent layer 2 is formed as a cured material of a one-step curable type silicone resin composition, for example, a compression molding method is used.

In order to form the transparent layer 2 as the cured material of the one-step curable type silicone resin composition by the compression molding method, first, a main agent and a cross-linking agent are mixed and the liquid mixture is prepared as a liquid transparent composition containing an uncured material of the one-step curable type silicone resin composition. Next, as shown in FIG. 3 (a), the transparent composition is charged into the compression molding machine 6 and subsequently, as shown in FIG. 3 (b), closing of the mold die 5 is performed with heating, so that the one-step curable type silicone resin composition is brought into a cured material and the transparent layer 2 which is prepared from the transparent composition containing the cured material is fabricated. Thereafter, the obtained transparent layer 2 is subjected to post curing as required.

In the compression molding machine, the pressure is, for example, 0.1 to 30 MPa, or preferably 1 to 10 MPa; the temperature is, for example, 80 to 200° C., or preferably 100 to 150° C.; and the duration is, for example, 1 to 300 minutes, or preferably 5 to 30 minutes.

The post curing performed in the compression molding method as required is a treatment so as to complete the curing of an uncured portion which remains in a small portion after substantially bringing the one-step curable type silicone resin composition into the cured material. The temperature thereof is, for example, 100 to 200° C., or preferably 100 to 180° C. and the duration thereof is, for example, 10 to 300 minutes, or preferably 30 to 180 minutes.

On the other hand, when the transparent layer 2 is formed from a transparent composition containing a thermosetting silicone resin composition after final curing, to be more specific, when the transparent layer 2 is formed as a second-step cured material of a two-step curable type silicone resin composition, for example, a compression molding method, a thermal pressing method, or a laminating method is used.

In order to form the transparent layer 2 as the second-step cured material of the two-step curable type silicone resin composition by the compression molding method, first, as shown in FIG. 3 (a), a liquid transparent composition containing an uncured material of a two-step curable type silicone resin composition is charged into the compression molding machine 6 and subsequently, as shown in FIG. 3 (b), closing of the mold die 5 is performed with heating, so that the two-step curable type silicone resin composition is brought into a second-step cured material at one time (by one step) and in this way, the transparent layer 2 which is prepared from the transparent composition containing the second-step cured material is fabricated. The conditions of the compression molding machine are as follows: the pressure of, for example, 0.1 to 30 MPa, or preferably 1 to 10 MPa; the temperature of, for example, 80 to 200° C., or preferably 100 to 150° C.; and the duration of, for example, 1 to 300 minutes, or preferably 10 to 60 minutes.

In order to form the transparent layer 2 as the second-step cured material of the two-step curable type silicone resin composition by the thermal pressing method, a liquid transparent composition containing an uncured material of the two-step curable type silicone resin composition is applied onto a substrate (not shown) to be then heated, so that the two-step curable type silicone resin composition is brought into a first-step cured material and the transparent sheet 7 (a B-stage sheet, ref: FIG. 4 (a)) which is prepared from the transparent composition containing the first-step cured material is formed. Thereafter, as shown in FIG. 4 (a), the transparent sheet 7 in a B-stage state is set into the thermal pressing machine 8 and then, as shown in FIG. 4 (b), thermal pressing is conducted, so that the two-step curable type silicone resin composition is brought into the second-step cured material and the transparent layer 2 which is prepared from the transparent composition containing the second-step cured material is fabricated.

The heating conditions of the transparent composition after application are the same as described above. The pressure in the thermal pressing machine 8 is, for example, 0.1 to 30 MPa, or preferably 1 to 10 MPa; the temperature is, for example, 80 to 200° C., or preferably 100 to 150° C.; and the pressing duration is, for example, 0.5 to 60 minutes, or preferably 1 to 30 minutes.

In order to form the transparent layer 2 as the second-step cured material of the two-step curable type silicone resin composition by the laminating method, a liquid transparent composition containing an uncured material of a two-step curable type silicone resin composition is applied onto a substrate to be then heated, so that as shown in FIG. 5 (a), the two-step curable type silicone resin composition is brought into a first-step cured material and two pieces of the transparent sheets 7 (B-stage sheets) which are prepared from the transparent composition containing the first-step cured material are formed. The fabrication conditions of the transparent sheets are the same as those of the thermal pressing method. Thereafter, as shown in FIG. 5 (b), in the one transparent sheet 7A, the through holes 9 are formed. Then, as shown in FIG. 5 (c), the one transparent sheet 7A and the other transparent sheet 7B are attached to each other by a thermal compression bonding. In this way, the two-step curable type silicone resin composition is brought into the second-step cured material and the transparent layer 2 which is prepared from the transparent composition containing the second-step cured material is fabricated.

The conditions of the thermal compression bonding are as follows: the pressure of, for example, 0.1 to 30 MPa, or preferably 1 to 10 MPa; the temperature of, for example, 80 to 200° C., or preferably 100 to 150° C.; and the duration of, for example, 0.5 to 60 minutes, or preferably 1 to 30 minutes.

When the transparent layer 2 is formed as the second-step cured material of the two-step curable type silicone resin composition, the first-step cured material of the two-step curable type silicone resin composition which is formed by the above-described compression molding method, thermal pressing method, laminating method, or the like can be subjected to the post curing. The conditions of the post curing is as follows: the temperature of, for example, 100 to 200° C., or preferably 100 to 180° C. and the duration of, for example, 10 to 300 minutes, or preferably 30 to 180 minutes.

In the formation of the transparent layer 2, preferably, the transparent layer 2 is formed as a first-step cured material of a two-step curable type silicone resin composition.

In this way, the transparent layer 2 in which the concave portions 4 are formed is fabricated.

Thereafter, in this method, as shown in FIG. 1, the phosphor encapsulating layers 3 fill the concave portions 4 in the transparent layer 2.

To be specific, the above-described phosphor encapsulating composition is poured into the concave portions 4 in the transparent layer 2 using a potting device.

To be specific, when the phosphor encapsulating composition contains an uncured material (before curing in the first step) of the two-step curable type silicone resin composition, the liquid phosphor encapsulating composition is poured into the concave portions 4 in the transparent layer 2.

On the other hand, when the phosphor encapsulating composition contains a silicone resin composition having both thermoplastic and thermosetting properties, the silicone resin composition having both thermoplastic and thermosetting properties is heated to be brought into a thermoplastic material and the phosphor encapsulating composition containing the thermoplastic material is poured into the concave portions 4 in the transparent layer 2. The heating temperature is, for example, 50 to 150° C., or preferably 80 to 120° C.

Thereafter, when the second silicone resin composition in the phosphor encapsulating composition is an uncured material (before curing in the first step) of the two-step curable type silicone resin composition, the two-step curable type silicone resin composition is brought into a first-step cured material by heating at, for example, 40 to 150° C. for 1 to 24 hours.

On the other hand, when the second silicone resin composition in the phosphor encapsulating composition is a thermoplastic material of the silicone resin composition having both thermoplastic and thermosetting properties, the silicone resin composition having both thermoplastic and thermosetting properties is solidified by allowing to stand at normal temperature for 0.1 to 24 hours.

In this way, the phosphor encapsulating layers 3 prepared from the phosphor encapsulating composition fill the concave portions 4.

In this way, the encapsulating sheet 1 including the transparent layer 2 and the phosphor encapsulating layers 3 is obtained.

FIG. 6 shows views for illustrating a method for producing one embodiment of the encapsulating sheet of the present invention: (*a*) illustrating a step of disposing the encapsulating sheet on a board and (*b*) illustrating a step of compressively bonding the encapsulating sheet with respect to the board. FIG. 7 shows a plan view of the board shown in FIG. 6 (*a*).

Next, a method for producing a light emitting diode device 10 using the encapsulating sheet 1 is described with reference to FIGS. 6 and 7.

First, in this method, as shown in FIGS. 6 (*a*) and 7, the board 12 on which the light emitting diode elements 11 are mounted is prepared.

The board 12 is formed into a generally flat plate shape. To be specific, the board 12 is formed of a laminated board in which a conductive layer provided with electrode pads 13 and a wire (not shown) is laminated, as a circuit pattern, on an insulating board. The insulating board is formed of, for example, a silicon board, a ceramic board, a polyimide resin board, or the like. Preferably, the insulating board is formed of a ceramic board, to be specific, a sapphire ($AL_2O_3$) board.

The electrode pads 13 are provided at spaced intervals to the region on which the light emitting diode elements 11 are mounted. To be specific, the electrode pads 13 are disposed at the end portions of the board 12. The conductive layer is formed of, for example, a conductor such as gold, copper, silver, or nickel. The thickness of the board 12 is, for example, 30 to 1500 μm, or preferably 500 to 1000 μm.

A plurality of the light emitting diode elements 11 are disposed in alignment at spaced intervals to each other in the plane direction on the upper surface of the board 12. Each of the light emitting diode elements 11 is formed into a generally rectangular shape in plane view and into a generally rectangular shape in sectional view. Each of the light emitting diode elements 11 is flip-chip-mounting connected or wire-bonding connected to the conductive layer in the board 12 and in this way, is electrically connected to the electrode pads 13. Each of the light emitting diode elements 11 is an element which emits blue light.

The thickness of each of the light emitting diode elements 11 is, for example, 50 to 300 μm, or preferably 100 to 200 μm. The length of one side thereof is, for example, 0.5 to 2 mm, or preferably 0.1 to 1.5 mm and the gap therebetween is, for example, 0.05 to 5.0 mm, or preferably 0.5 to 3.5 mm. The pitch of each of the light emitting diode elements 11 (that is, the total of the above-described gap and the above-described length of one side) is, for example, 1 to 5 mm.

Next, the encapsulating sheet 1 shown in FIG. 1 is prepared and as shown in FIG. 6 (*a*), the encapsulating sheet 1 which is reversed upside down is disposed at the upper side of the board 12 so that each of the phosphor encapsulating layers 3 and each of the light emitting diode elements 11 are opposed to each other in the thickness direction. Thereafter, as shown by arrows in FIG. 6 (*a*), and FIG. 6 (*b*), the encapsulating sheet 1 is compressively bonded to the board 12 so that each of the phosphor encapsulating layers 3 embeds each of the light emitting diode elements 11.

The temperature of the compression bonding is, for example, 70 to 250° C., or preferably 100 to 200° C.; the pressure is, for example, 0.1 to 10 MPa, or preferably 0.5 to 5 MPa; and the duration is, for example, 1 to 60 minutes, or preferably 5 to 30 minutes.

Thereafter, when the transparent composition in the transparent layer 2 and/or the phosphor encapsulating composition in the phosphor encapsulating layer 3 contain/contains a thermosetting silicone resin composition before final curing, the transparent layer 2 and/or the phosphor encapsulating layer 3 are/is heated, so that the transparent composition and/or the phosphor encapsulating composition are/is cured (subjected to the post curing).

The temperature of the post curing is, for example, 80 to 200° C., or preferably 100 to 180° C. and the heating duration is, for example, 10 to 300 minutes, or preferably 30 to 180 minutes.

In this way, the light emitting diode elements 11 are encapsulated by the phosphor encapsulating layers 3.

In the encapsulating sheet 1, the method for producing the light emitting diode device 10 using the encapsulating sheet 1, and the light emitting diode device 10 produced by the method, the transparent layer 2 is formed from the transparent composition containing the first silicone resin composition, so that a crack and coloring (to be specific, yellowing or the like) in the transparent layer 2 can be suppressed.

The transparent layer 2 is formed from the transparent composition containing the first silicone resin composition and the phosphor encapsulating layers 3 are formed from the phosphor encapsulating composition containing the second silicone resin composition, so that the affinity between the transparent layer 2 and the phosphor encapsulating layers 3 is high and therefore, a peeling therebetween can be suppressed.

The phosphor encapsulating layers 3 are, in the concave portions 4 formed in the transparent layer 2, formed from the phosphor encapsulating composition containing the phosphor. The light emitting diode elements 11 are embedded by the phosphor encapsulating layers 3, so that the mixing amount of the phosphor in the phosphor encapsulating layers 3 in which the light emitting diode elements 11 are embedded is sufficiently ensured and light emitted from the light emitting diode elements 11 can be surely converted, while the mixing amount of the phosphor in the encapsulating sheet 1 can be reduced, compared with that in a case where the phosphor encapsulating layer 3 is formed on the entire surface of the transparent layer 2.

Therefore, the production cost of the encapsulating sheet 1 can be reduced.

As a result, in the method for producing the light emitting diode device 10 using the encapsulating sheet 1, the production cost of the light emitting diode device 10 can be reduced.

In the embodiment in FIG. 2 (*a*), the concave portion 4 is formed into a generally circular shape in plane view. Alternatively, for example, though not shown, the concave portion 4 can be formed into a generally rectangular shape in plane view. In such a case, the length of one side of the concave portion 4 is, for example, 1 to 10 mm, or preferably 1 to 5 mm.

In the embodiments in FIGS. 1 and 6 (*b*), a plurality of the concave portions 4 are formed in the encapsulating sheet 1 and the phosphor encapsulating layers 3 fill the concave portions 4, so that a plurality of the light emitting diode elements 11 are encapsulated by the phosphor encapsulating layers 3. Alternatively, for example, though not shown, one piece of the concave portion 4 is formed and the phosphor encapsulating layer 3 fills the concave portion 4, so that one piece of the light emitting diode element 11 can be encapsulated by the phosphor encapsulating layer 3.

Also, though not shown in FIG. 1, for example, a light scattering layer, a protecting layer (a high-hardness layer or the like), or the like can be laminated on the lower surface of the transparent layer 2.

EXAMPLES

While the present invention will be described hereinafter in further detail with reference to Production Examples, Comparative Production Examples, Examples, and Comparative Examples, the present invention is not limited to these Production Examples, Comparative Production Examples, Examples, and Comparative Examples.

<Fabrication of Transparent Layer>

Production Example 1

(Transparent Layer: Silicone Resin Composition in C-stage State)

A liquid and B liquid in an addition reaction curable type silicone resin composition (trade name: LR-7665, manufactured by WACKER ASAHIKASEI SILICONE CO., LTD.) were mixed at a mixing ratio of 1/1 to prepare a liquid mixture.

Next, the liquid mixture was charged into a compression molding machine (ref: FIG. 3 (*a*)) and mold closing thereof was performed at a pressure of 1.6 MPa, a temperature of 130° C., for 5 minutes, so that a transparent layer was formed (ref: FIG. 3 (*b*)) to be then subjected to a post curing at 150° C. for 2 hours (ref: FIG. 3).

The thickness of the transparent layer was 1 mm and in the transparent layer, nine pieces of concave portions that were dented from the surface inwardly were formed. Each of the concave portions was formed into a circular shape having an inner diameter of 2 mm and a depth of 0.5 mm. The gap between the concave portions was 1 mm (ref: FIG. 2).

The addition reaction curable type silicone resin composition in the transparent layer was in a C-stage state.

Production Example 2

(Transparent Layer: Silicone Resin Composition in B-stage State)

15.71 g (0.106 mol) of a vinyltrimethoxysilane (an ethylenic silicon compound) and 2.80 g (0.0118 mol) of a (3-glycidoxypropyl)trimethoxysilane (an epoxy group-containing silicon compound) were blended with respect to 2031 g (0.177 mol) of a polydimethylsiloxane containing silanol groups at both ends (a polysiloxane containing silanol groups at both ends, in general formula (1), all of the $R^1$s are methyl, an average of "n" is 155, a number average molecular weight of 11500, a silanol group equivalent of 0.174 mmol/g) to be stirred and mixed.

The molar ratio (the number of moles in SiOH group/the total number of moles in $SiOCH_3$ group) of the SiOH group in the polydimethylsiloxane containing silanol groups at both ends to the $SiOCH_3$ group in the vinyltrimethoxysilane and the (3-glycidoxypropyl)trimethoxysilane was 1/1.

After the stirring and mixing, 0.97 mL (0.766 g, the content of the catalyst: 0.88 mmol, corresponding to 0.50 mol with respect to 100 mol of the polydimethylsiloxane containing silanole groups at both ends) of a methanol solution of the tetramethylammonium hydroxide (a condensation catalyst, a concentration of 10 mass %) was added thereto to be stirred at 40° C. for 1 hour. Thereafter, the obtained mixture was stirred under a reduced pressure (10 mmHg) at 40° C. for 1 hour and volatile components (methanol or the like) were removed.

Thereafter, the pressure of the system was brought back to the normal pressure and then, 44.5 g (0.022 mol) of an organohydrogensiloxane (manufactured by Shin-Etsu Chemical Co., Ltd., a dimethylpolysiloxane-co-methylhydrogenpolysiloxane, a number average molecular weight of 2000, a hydrosilyl group equivalent of 7.14 mmol/g) was added to the reacting product to be stirred at 40° C. for 1 hour.

The molar ratio ($CH_2$=CH—/SiH) of the vinyl group ($CH_2$=CH—) in the vinyltrimethoxysilane to the hydrosilyl group (the SiH group) in the organohydrogensiloxane was 1/3.

Thereafter, 0.13 g (0.13 mL, the content of the platinum of 2 mass %, as a platinum corresponding to $5.8 \times 10^{-3}$ parts by mass with respect to 100 parts by mass of the organohydrogensiloxane) of a siloxane solution of a platinum carbonyl complex (an addition catalyst, a platinum concentration of 2 mass %) was added to the system to be stirred at 40° C. for 10 minutes, so that a thermosetting silicone resin composition (a condensation reaction and addition reaction curable type silicone resin composition) in a liquid state at normal temperature was obtained.

Next, the thermosetting silicone resin composition was applied onto a PET film having a thickness of 50 μm so as to have a thickness of 0.5 mm. Then, the obtained film was heated at 135° C. for 10 minutes, so that a transparent sheet prepared from a thermosetting silicone resin composition in a B-stage state was formed.

Thereafter, two pieces of sheets each having a size of 10 mm×10 mm were cut out from the transparent sheet (ref: FIG. 5 (*a*)) and nine pieces of through holes were formed in one piece of sheet (ref: FIG. 5 (*b*)). Each of the through holes was formed into a circular shape having an inner diameter of 2 mm. The gap between the through holes was 1 mm.

Next, one piece of sheet in which the through holes were formed and the other piece of sheet were attached to each other by a laminator, so that a transparent layer in which concave portions corresponding to the through holes were formed was fabricated (ref: FIG. 5 (c)).

Comparative Production Example 1

(Transparent Layer: Epoxy Resin Composition)

45 parts by mass of a bisphenol A epoxy resin (Epicoat EP1256, an epoxy equivalent of 7500, manufactured by Japan Epoxy Resins Co., Ltd.), 33 parts by mass of an alicyclic epoxy resin (EHPE3150, an epoxy equivalent of 260, manufactured by Daicel Corporation), 22 parts by mass of 4-methylhexahydrophthalic anhydride (MH-700, manufactured by New Japan Chemical Co., Ltd.), and 1.2 parts by mass of 2-methylimidazole (manufactured by SHIKOKU CHEMICALS CORPORATION) were dissolved in methyl ethyl ketone so as to have a solid concentration of 50 mass %, so that an epoxy resin composition solution was prepared.

Next, the epoxy resin composition solution was applied onto a PET film (a size of 30 cm×10 cm) having a thickness of 50 μm so as to have a thickness of 0.1 mm. Then, the obtained film was heated at 130° C. for 2 minutes to be dried, so that a base sheet in a C-stage state was formed.

Thereafter, the same operation was repeated nine times, so that a total of 10 pieces of base sheets (each having a size of 30 cm×10 cm) were prepared.

Thereafter, 10 pieces of the base sheets were thermally laminated at 100° C., so that a transparent sheet having a thickness of 1.0 mm was fabricated.

Thereafter, a piece of sheet having a size of 10 mm×10 mm was cut out from the transparent sheet and nine pieces of the concave portions were formed in the piece of sheet, so that a transparent layer was fabricated. The size of the concave portion was the same as that of the concave portion in Production Example 1.

<Production of Encapsulating Sheet>

Example 1

(Transparent Layer: Silicone Resin Composition in C-Stage State/Phosphor Encapsulating Layer Phosphor+ Thermoplastic Material of Silicone Resin Composition)

35.8 mL (160.6 mol) of a tetraethoxysilane was gradually added dropwise to a liquid mixture of 66.8 mL (158.6 mol) of tetramethyl ammonium hydroxide (a 25% methanol solution), 32.8 mL of methanol, and 24.6 mL of a distilled water. The obtained mixture was stirred for a whole day to be allowed to react.

Then, the reaction liquid was filtrated and the filtrate was added dropwise to a liquid mixture of 428 mL of hexane, 7.1 g (75 mmol) of a dimethylchlorosilane, and 24.4 g (225 mmol) of a trimethylchlorosilane. The obtained mixture was stirred for a whole day. Thereafter, the reacting product was extracted with hexane and magnesium sulfate was added to the extract to be dried. Thereafter, the hexane was once removed and then, the hexane was further added to the obtained mixture so as to cause recrystallization, so that a white and solid cage octasilsesquioxane was obtained.

It was confirmed by a $^1$H-NMR that the obtained cage octasilsesquioxane had a structure in formula (6), and $R^5$ was a methyl group and $R^6$ was hydrogen or a methyl group in formula (6). The molar ratio (an average value in the cage octasilsesquioxane as a whole) of the methyl group to the hydrogen in $R^6$ was calculated and determined to be methyl group: hydrogen=6:2.

0.36 g of the obtained cage octasilsesquioxane, 0.24 g of a polysiloxane containing alkenyl groups at both ends (in formula (7), $R^7$ is a methyl group, $R^8$ is a vinyl group, "a" is 8; a number average molecular weight of 800), 1 g of toluene, and 0.1 μL of a platinum-divinylsiloxane complex solution (a hydrosilylation catalyst, a toluene solution, a platinum concentration of 2 mass %) were blended and the obtained mixture was stirred at 50° C. for 15 hours. In this way, a silicone resin precursor was obtained. The molar ratio (=vinyl group/hydrosilyl group) of the vinyl group in the polysiloxane containing alkenyl groups at both ends to the hydrosilyl group in the cage octasilsesquioxane was 0.91.

Thereafter, 0.03 g (5.0 parts by mass with respect to 100 parts by mass of the total amount of the cage octasilsesquioxane and the polysiloxane containing alkenyl groups at both ends) of a straight chain siloxane-containing polysiloxane (in formula (8), $R^9$ is a methyl group, $R^{10}$ is a vinyl group, "b"=120, "c"=10; a number average molecular weight of 10000, the content of the vinyl group of 0.98 mmol/g) was blended in the obtained silicone resin precursor to be mixed.

The ratio (X/Y) of the vinyl group in the straight chain siloxane-containing polysiloxane to the residual hydrosilyl group in the silicone resin precursor was, in molar ratio, 0.49.

Thereafter, the toluene was distilled off, so that a white turbid and solid silicone resin composition (a silicone resin composition having both thermoplastic and thermosetting properties) was obtained.

The content ratio of the straight chain siloxane containing polysiloxane in the silicone resin composition was 4.8 mass %.

Thereafter, 87 g of the silicone resin composition was heated at 80° C. to be melted so as to be brought into a thermoplastic material. 13 g of a phosphor ($Y_3Al_5O_{12}$:Ce (YAG:Ce), a sphere shape, an average particle size of 17 μm) was added thereto to be uniformly stirred, so that a phosphor encapsulating composition containing the phosphor and the thermoplastic material of the silicone resin composition was prepared.

Thereafter, 1.7 mg of the phosphor encapsulating composition was poured into each of the concave portions in the transparent layer in Production Example 1 using a potting device to be then allowed to stand at normal temperature for 24 hours and the phosphor encapsulating composition was solidified, so that a phosphor encapsulating layer was formed. In this way, an encapsulating sheet including the transparent layer and the phosphor encapsulating layers which filled the concave portions was obtained.

Example 2

(Transparent Layer: Silicone Resin Composition in B-stage State/Phosphor Encapsulating Layer Phosphor+ Thermoplastic Material of Silicone Resin Composition)

A phosphor encapsulating composition was poured and subsequently, a phosphor encapsulating layer was formed, so that an encapsulating sheet was obtained in the same manner as in Example 1, except that the transparent layer (the transparent layer prepared from the silicone resin composition in a B-stage state) in Production Example 2 was used instead of the transparent layer (the transparent layer prepared from the silicone resin composition in a C-stage state) in Production Example 1.

Example 3

(Transparent Layer: Silicone Resin Composition in C-Stage State/Phosphor Encapsulating Layer Phosphor+Silicone Resin Composition in B-Stage State)

A thermosetting silicone resin composition (a condensation reaction and addition reaction curable type silicone resin composition) in an A-stage state and a liquid state at normal temperature, which was the same as that in Production Example 2, was prepared.

Thereafter, 13 g of a phosphor ($Y_3Al_5O_{12}$:Ce (YAG:Ce), a sphere shape, an average particle size of 17 µm) was added to 87 g of the thermosetting silicone resin composition to be uniformly stirred, so that a phosphor encapsulating composition containing a phosphor and a thermosetting silicone resin composition (an uncured material) was prepared.

Thereafter, 1.7 mg of the phosphor encapsulating composition was poured into each of the concave portions in the transparent layer in Production Example 1 using a potting device to be then heated at 135° C. for 10 minutes and the thermosetting silicone resin composition of the phosphor encapsulating composition was brought into a B-stage state, so that a phosphor encapsulating layer was formed. In this way, an encapsulating sheet including the transparent layer and the phosphor encapsulating layers which filled the concave portions was obtained.

Comparative Example 1

(Transparent Layer: Epoxy Resin Composition in C-Stage State/Phosphor Encapsulating Layer: Phosphor+Thermoplastic Material of Silicone Resin Composition)

A phosphor encapsulating composition was poured and subsequently, a phosphor encapsulating layer was formed, so that an encapsulating sheet was obtained in the same manner as in Example 1, except that the transparent layer (the transparent layer prepared from the epoxy resin composition in a C-stage state) in Comparative Production Example 1 was used instead of the transparent layer (the transparent layer prepared from the silicone resin composition in a C-stage state) in Production Example 1.

Comparative Example 2

(Single Layered Sheet of Phosphor Encapsulating Layer: Phosphor+Thermoplastic Material of Silicone Resin Composition)

A thermosetting silicone resin composition (a condensation reaction and addition reaction curable type silicone resin composition) in a liquid state at normal temperature, which was the same as that in Production Example 2, was prepared.

Thereafter, 7.7 g of a phosphor ($Y_3Al_5O_{12}$:Ce (YAG:Ce), a sphere shape, an average particle size of 17 µm) was added to 92.3 g of the thermosetting silicone resin composition to be uniformly stirred, so that a phosphor encapsulating composition containing the phosphor and the thermosetting silicone resin composition (an uncured material) in an A-stage state was prepared.

Thereafter, the phosphor encapsulating composition was applied onto a PET film having a thickness of 50 µm so as to have a thickness of 1.0 mm. Then, the obtained film was heated at 135° C. for 10 minutes, so that a single layered sheet of a phosphor encapsulating layer formed from the phosphor encapsulating composition containing the phosphor and the thermosetting silicone resin composition in a B-stage state was formed.

The obtained single layered sheet of a phosphor encapsulating layer served as an encapsulating sheet.

<Production of Light Emitting Diode Device>

A board in which nine pieces of light emitting diode elements were mounted was prepared. Each of the light emitting diode elements was formed into a generally rectangular shape in plane view. The size of each of the light emitting diode elements was as follows: the thickness of 200 µm and the length of 1 mm×1 mm. The gap between the light emitting diode elements was 2 mm and the pitch thereof was 3 mm.

Thereafter, the encapsulating sheet was disposed at the upper side of the board so that phosphor encapsulating layers were opposed to the light emitting diode elements in the thickness direction (ref: FIG. 6 (a)). Thereafter, the encapsulating sheet was compressively bonded to the board so that each of the phosphor encapsulating layers embedded each of the light emitting diode elements (ref: FIG. 6 (b)). The conditions of the compression bonding were as follows: the temperature of 130° C., the pressure of 0.1 MPa, and the duration of 10 minutes.

Then, the obtained product was heated at 150° C. for 2 hours to be subjected to a post curing (after-curing).

To be specific, in Examples 1 and 3, by performing the post curing, the silicone resin compositions in the phosphor encapsulating layers were cured.

In Example 2, the silicone resin compositions in the transparent layer and the phosphor encapsulating layer were cured.

In Comparative Example 1, the silicone resin composition in the phosphor encapsulating layer was cured.

In Comparative Example 2, the silicone resin composition in the single layered sheet of a phosphor encapsulating layer was cured.

In this way, a light emitting diode device in which the light emitting diode elements were encapsulated by the encapsulating sheet was produced.

(Evaluation)

1. Mixing Amount of Phosphor

The mixing amount of the phosphor which was blended in one piece of the encapsulating sheet in the light emitting diode device was calculated. The results are shown in Table 1.

2. Chromaticity

An electric current of 250 mA was applied through the light emitting diode device, so that the light emitting diode elements were allowed to light up and the CIE chromaticity diagram (y value) thereof at the time was measured. The results are shown in Table 1.

3. Appearance

An electric current of 250 mA was applied through the light emitting diode device, so that the light emitting diode elements were allowed to light up for 300 hours and the appearance (the following 3-1. to 3-4.) thereof before and after the lighting up test was measured, respectively.

The results are shown in Table 1.

3-1. Coloring of Transparent Layer

Excellent: Coloring was not observed on the transparent layer after the test.

Bad: Yellowing was observed on the transparent layer after the test.

In Comparative Production Example 2, there was no transparent layer and therefore, the present evaluation was not conducted.

3-2. Crack in Transparent Layer

Excellent: Crack was not observed in the transparent layer after the test.

Bad: Crack was observed in the transparent layer after the test.

3-3. Peeling Between Transparent Layer and Phosphor Encapsulating Layer

Excellent: Peeling was not observed between the transparent layer and the phosphor encapsulating layer after the test.

Good: Partial peeling was observed between the transparent layer and the phosphor encapsulating layer after the test.

In Comparative Production Example 2, there was no transparent layer and therefore, the present evaluation was not conducted.

3-4. Peeling between Encapsulating Sheet and Board

Excellent: Peeling was not observed between the encapsulating sheet and the board after the test.

Good: Partial peeling was observed between the encapsulating sheet and the board after the test. To be specific, the peeling was observed on the interfacial surface between the transparent layer and the board.

TABLE 1

| | | Light Emitting Diode Device | | | | |
|---|---|---|---|---|---|---|
| | | Ex. 1 | Ex. 2 | Ex. 3 | Comp. Ex. 1 | Comp. Ex. 2 |
| Encapsulating Sheet | Transparent Layer | Silicone Resin Composition in C-stage State | Silicone Resin Composition in B-stage State | Silicone Resin Composition in C-stage State | Epoxy Resin Composition in C-stage State | — |
| | Phosphor Encapsulating Layer | Phosphor + Thermoplastic Material of Silicone Resin Composition | Phosphor + Thermoplastic Material of Silicone Resin Composition | Phosphor + Silicone Resin Composition in B-stage State | Phosphor + Silicone Resin Composition in B-stage State | Phosphor + Silicone Resin Composition in B-stage State |
| Amount of Phosphor Per One Piece of Encapsulating Sheet (mg) | | 2.0 | 2.0 | 2.0 | 2.0 | 8.2 |
| Chromaticity (CIE, y Value) | | 0.34 | 0.34 | 0.34 | 0.34 | 0.35 |
| Appearance | Coloring of Transparent Layer | Excellent | Excellent | Excellent | Bad | — |
| | Crack of Transparent Layer | Excellent | Excellent | Excellent | Bad | Excellent |
| | Peeling between Transparent Layer and Phosphor Encapsulating Layer | Excellent | Excellent | Excellent | Good | — |
| | Peeling between Encapsulating Sheet and Board | Good | Excellent | Good | Good | Excellent |

While the illustrative embodiments of the present invention are provided in the above description, such is for illustrative purpose only and it is not to be construed as limiting the scope of the present invention. Modification and variation of the present invention that will be obvious to those skilled in the art is to be covered by the following claims.

What is claimed is:

1. An encapsulating sheet comprising:
a transparent layer having a recess formed in an upper surface, and
a phosphor encapsulating layer filling the recess, wherein
the transparent layer is formed from a transparent composition containing a first silicone resin composition,
the phosphor encapsulating layer is formed from a phosphor encapsulating composition containing a phosphor and a second silicone resin composition,
the phosphor encapsulating layer is in a B-stage,
the second silicone resin composition is a thermosetting silicone resin composition which is a first-step cured material of a two-step curable silicone resin composition or a thermoplastic material of a silicone resin composition having both thermoplastic and thermosetting properties which is solidified after heating, and
wherein the encapsulating sheet being an encapsulating sheet for use in producing a light emitting diode device.

2. The encapsulating sheet according to claim 1, wherein the first silicone resin composition is a thermosetting silicone resin composition.

3. The encapsulating sheet according to claim 2, wherein the thermosetting silicone resin composition is a thermosetting silicone resin composition before final curing.

4. The encapsulating sheet according to claim 3, wherein the thermosetting silicone resin composition before final curing in the transparent layer is a first-step cured material of a two-step curable type silicone resin composition.

5. The encapsulating sheet according to clam 1, wherein the transparent layer comprises a plurality of the concave portions disposed in alignment at spaced intervals to each other in the plane direction of the transparent resin layer, and
a plurality of the phosphor encapsulating layers each fill each of the plurality of concave portions.

* * * * *